(12) United States Patent
Tsujimoto

(10) Patent No.: US 10,048,298 B2
(45) Date of Patent: Aug. 14, 2018

(54) THIN-FILM SENSOR TYPE ELECTRICAL POWER MEASUREMENT DEVICE

(71) Applicant: SIRC Co., LTD, Osaka (JP)

(72) Inventor: Hiroaki Tsujimoto, Osaka (JP)

(73) Assignee: SIRC CO., LTD, Osaka (JP)

( * ) Notice: Subject to any disclaimer, the term of this patent is extended or adjusted under 35 U.S.C. 154(b) by 188 days.

(21) Appl. No.: 14/648,243

(22) PCT Filed: Nov. 21, 2013

(86) PCT No.: PCT/JP2013/006856
§ 371 (c)(1),
(2) Date: May 28, 2015

(87) PCT Pub. No.: WO2014/083812
PCT Pub. Date: Jun. 5, 2014

(65) Prior Publication Data
US 2015/0316591 A1  Nov. 5, 2015

(30) Foreign Application Priority Data

Nov. 29, 2012 (JP) ................................. 2012-260734

(51) Int. Cl.
*G01R 21/00* (2006.01)
*G01R 21/08* (2006.01)
(Continued)

(52) U.S. Cl.
CPC ........... *G01R 21/00* (2013.01); *G01R 15/205* (2013.01); *G01R 21/08* (2013.01); *G01R 33/096* (2013.01); *G01R 17/10* (2013.01); *G01R 33/09* (2013.01)

(58) Field of Classification Search
None
See application file for complete search history.

(56) References Cited

U.S. PATENT DOCUMENTS 5,889,403 A * 3/1999 Kawase ................ G01R 33/02
324/249
5,933,003 A 8/1999 Hebing et al.
(Continued)

FOREIGN PATENT DOCUMENTS

CN  101153882 A  4/2008
CN  102062807 A  5/2011
(Continued)

OTHER PUBLICATIONS

Yoda et al.: Proceedings of the International Magnetics Conference, Mar. 28-31, 1989, 2 pages.
(Continued)

*Primary Examiner* — Jermele M Hollington
*Assistant Examiner* — Douglas X Rodriguez
(74) *Attorney, Agent, or Firm* — EIP US LLP

(57) ABSTRACT

An electrical power measurement device measures electrical power consumed in a circuit to be measured including a power source, a load, and a pair of electric wires connecting the power source with the load. The device includes a sensor unit including a plurality of the sensor parts including a magnetic element in which element terminals are formed at both ends of a magnetic film, a measurement resistor connected to the magnetic element in series, and a detecting means that detects a voltage change of the magnetic element and outputs a predetermined component; an addition means that adds the outputs of the detecting means of all of the sensor parts; and a fixing means that fixes the magnetic elements of the sensor parts, at equal distance positions from a virtual axis serving as a position reference at which the one electric wire is arranged, in a direction facing the virtual axis.

10 Claims, 25 Drawing Sheets

(51) Int. Cl.
  *G01R 15/20* (2006.01)
  *G01R 33/09* (2006.01)
  *G01R 17/10* (2006.01)

(56) References Cited

U.S. PATENT DOCUMENTS

| | | | |
|---|---|---|---|
| 6,175,229 | B1 | 1/2001 | Becker et al. |
| 7,259,546 | B1 | 8/2007 | Hastings et al. |
| 2005/0156587 | A1 | 7/2005 | Yakymyshyn et al. |
| 2005/0242804 | A1* | 11/2005 | Hintz ............... G01R 33/02 324/244 |
| 2009/0315555 | A1 | 12/2009 | Heger |
| 2010/0090684 | A1 | 4/2010 | Chen et al. |
| 2011/0043200 | A1 | 2/2011 | Miyahara |
| 2011/0121828 | A1 | 5/2011 | Gati et al. |
| 2011/0202295 | A1 | 8/2011 | Tamura et al. |
| 2012/0229131 | A1 | 9/2012 | Takenaga et al. |
| 2012/0290240 | A1 | 11/2012 | Fukui |
| 2014/0049253 | A1* | 2/2014 | Tsujimoto ............... G01R 21/08 324/228 |

FOREIGN PATENT DOCUMENTS

| | | |
|---|---|---|
| CN | 102099695 A | 6/2011 |
| CN | 102656471 A | 9/2012 |
| EP | 2682766 A1 | 1/2014 |
| JP | 6474457 A | 3/1989 |
| JP | H10-506193 A | 6/1998 |
| JP | H10-232259 A | 9/1998 |
| JP | 2000258463 A | 9/2000 |
| JP | 2000258464 A | 9/2000 |
| JP | 2001153895 A | 6/2001 |
| JP | 2003315376 A | 11/2003 |
| JP | 2005061980 A | 3/2005 |
| JP | 2009063396 A | 3/2009 |
| JP | 2010091545 A | 4/2010 |
| JP | 201147731 A | 3/2011 |
| JP | 2011043422 A | 3/2011 |
| JP | 2011164019 A | 8/2011 |
| JP | 2012083241 A | 4/2012 |
| WO | 2006131468 A1 | 12/2006 |
| WO | 2010009761 A1 | 1/2010 |
| WO | 2012105459 A1 | 8/2012 |

OTHER PUBLICATIONS

Extended European Search Report dated Jul. 19, 2016 for Application No. 13858292.9.
International Search Report dated Dec. 17, 2013 on related application PCT/JP2013/006856 filed Nov. 21, 2013.
Hiroaki Tsujimoto et al. "Magnetic thin film power sensor using a magneto resistance effect" (The Institute of Electrial Engineers of Japan, Journal of Technical Meeting of Magnetics, vol. MAG-11, No. 096) Nov. 24, 2011.
Tsujimoto et al. "Thin film power meter using magnetic thin film" (The Institute of Electrical Engineers of Japan, Journal of Technical Meeting of Magnetics, vol. MAG-05, No. 182) Dec. 12, 2005.
Japanese office Action dated Oct. 31, 2017 on related JP Application No. 2014-549805, filed Nov. 29, 2012.

* cited by examiner

THIN-FILM SENSOR TYPE ELECTRICAL POWER MEASUREMENT DEVICE

CROSS-REFERENCE TO RELATED APPLICATIONS

The present application is a continuation of International Application No. PCT/JP2013/006856, filed Nov. 11, 2013, which claims priority to Japanese Patent Application No. 2012-260734, filed Nov. 29, 2012. Each of the above-referenced patent applications is incorporated by reference in its entirety.

TECHNICAL FIELD

The present invention relates to various thin-film sensor type electrical power measurement devices which are simplified in structure and reduced in size and capable of measuring electrical power consumed in high-frequency circuits or batteries.

BACKGROUND ART

In recent years, while an environment for using the internet or the like has been prepared, measurement systems including remote metering of electrical power have been developed. In the past, in order to measure electrical power, an integrating wattmeter that converts an amount of used electrical power into the number of revolutions of a disk and performs an integration operation has been used. Recently, an ammeter (CT), a voltmeter (PT), or a sensor detecting a rotation is newly added to the integrating wattmeter, and electrical power is measured by performing a multiplication calculation through an electronic circuit or a microprocessor.

However, the integrating wattmeter is complicated in a device structure and large in a device size. In addition, in the integrating wattmeter, since electrical power is mechanically output, there is a problem in that it is difficult to perform digital management. Furthermore, since consumed electrical power is converted into rotation of the disk, a loss occurs, and extra energy is likely to be consumed.

In this regard, it is desirable to develop a compact integrated wattmeter which is capable of measuring consumed electrical power as a quantity of electricity without change.

For example, an electrical power measurement device and a magnetic field sensor which are capable of measuring electrical power consumption as a quantity of electricity using a magneto-resistance effect of a magnetic thin film have been proposed as the compact integrated wattmeter (Non-Patent Literatures 1 and 2). The electrical power measurement device and the magnetic field sensor are configured to employ a magnetic thin film (configured on a substrate) arranged in parallel to a primary conductor through which an alternating current (AC) flows is used, to cause a primary voltage to be applied to both ends of a magnetic thin film via a resistor, and to extract an output from both ends of the magnetic thin film. In the electrical power measurement device and the like, a scheme of extracting electrical power IV from an amplitude value of a double frequency component is employed.

The electrical power measurement device and the like are configured to extract a signal component that is in proportion to electrical power based on the fact that linear characteristics can be obtained without a bias magnetic field using a planar hall effect (PHE) that is a phenomenon that in a ferromagnet including a magnetic thin film, an electrical resistance value of a magnetic substance varies depending on an angle formed by an electric current and magnetization (this electrical power measuring apparatus is referred to as a "planar hole type electrical power measurement device" or a "PHE type electrical power measurement device").

The magnetic field sensor used herein is an element of converting a change in an external magnetic field into an electrical signal. The magnetic field sensor is configured such that a magnetic thin film such as a ferromagnetic thin film or a semiconductor thin film is patterned, and causes an electric current to flow to the pattern of the magnetic thin film and converts a change in an external magnetic field into an electrical signal as a change in a voltage.

However, in the PHE type electrical power measurement device, a voltage to be detected has to be output from the magnetic thin film in a direction orthogonal to a load current of the primary conductor. That is, the voltage has to be outputted from both ends of the magnetic thin film in a width direction. Thus, in the PHE type electrical power measurement device, the magnetic thin film needs to have a relatively large width, and it is difficult to use a magnetic thin film having a narrow width shape (which means a shape that is fine in a longitudinal direction such as a straight line shape, or a rectangular shape).

Further, the PHE type electrical power measurement device has a shape restriction that the magnetic thin film has to be configured with a bridge circuit configuration. This means that in the PHE type electrical power measurement device, it is difficult to install it on a special line such as a microstrip line or a coplanar line used in a high-frequency circuit.

In addition, a bolometer and a precise measurement device are used as an electrical power measurement device for a high frequency. However, the bolometer and the precise measurement device have a complicated large configuration and are very expensive and thus are hardly used for electrical power measurement and detection of each device or each facility.

CITATION LIST

Patent Literature

Patent Literature 1: JP 10-232259 A

Non-Patent Literature

Non-Patent Literature 1: Thin film wattmeter using magnetic thin film (The Institute of Electrical Engineers of Japan, Journal of Technical Meeting of Magnetics, Vol. MAG-05, No. 182) Non-Patent Literature 2: Thin film wattmeter using magnetic thin film (The Institute of Electrical Engineers of Japan, Journal of Technical Meeting of Magnetics, Vol. MAG-05, No. 192)

SUMMARY OF INVENTION

Problem to be Solved

In the wattmeter employing the magnetic thin film, a positional relationship between a conducting wire through which an electric current flows and the magnetic thin film is consequential. A leakage detection device disclosed in Patent Literature 1 in which the relation between the magnetic thin film and the conducting wire is disclosed is convenient and can be somewhat reduced in size. However, since a ring-like magnetic substance is used, the size reduction is necessarily restricted. Further, since it is necessary to cause an electric wire A and an electric wire B from a power source to pass through a hole of a ring, when an electric wire is thick, the size of the ring-like magnetic substance is increased. Furthermore, it is not easy to arrange the ring-like magnetic substance on the electric wire arranged already. For example, as in a clamp type ammeter, time and effort to open a part of the ring-like magnetic substance, to insert the electric wire from the opened portion into the hole, and to return the ring-like magnetic substance to form a closed circuit of a magnetic flux are necessary.

Further, while a circuit board is integrated for size reduction, since two power line patterns from a power source has to be surrounded together by the magnetic substance, it is extremely difficult to attach it later. In the wattmeter employing the magnetic thin film, it is possible to attach the magnetic thin film to an already installed wire, and regardless of a portion of the wire to which the magnetic thin film is attached, it is necessary to decide a positional relationship between the wire and the magnetic thin film.

Solution to Problem

The present invention was made in light of the foregoing, and it is desirable to provide an electrical power measurement device that can be easily installed later even in an already wired circuit and can be reduced in size.

More specifically, an electrical power measurement device of the present invention measures electrical power consumed in a circuit to be measured including a power source, a load, and a pair of electric wires connecting the power source with the load, and the electrical power measurement device includes:

a pair of connection terminals for connecting the load in parallel to the power source;

a sensor part including a magnetic element in which element terminals are formed at both ends of a magnetic film, a measurement resistor connected to the magnetic element in series, and a detecting means that detects a voltage change of the magnetic element and outputs a predetermined component, the sensor part being connected to the circuit to be measured via the pair of connection terminals;

a sensor unit including a plurality of the sensor parts;

an addition means that adds outputs of the detecting means of all the sensor parts; and a fixing means that fixes the magnetic elements of the sensor parts, at equal distance positions from a virtual axis serving as a position reference at which the one electric wire is arranged, in a direction facing the virtual axis.

Advantageous Effects of Invention

Since the electrical power measurement device according to the present invention includes a sensor part employing a magnetic thin film, a compact sensor part can be manufactured. Thus, the sensor part can be arranged in an already completed circuit to be measured later. Further, since the structure of interposing a conducting wire serving as a target to be measured in the sensor part is provided, it is possible to secure a positional relationship between the sensor part and the conducting wire with a sufficient measurement accuracy.

DESCRIPTION OF EMBODIMENTS

Hereinafter, an electrical power measurement device according to the present invention will be described with reference to the appended drawings. The following description is intended to describe an exemplary embodiment of the present invention, and the present invention is not limited to the following embodiments. The following embodiments can be modified within the scope not departing the gist of the present invention.

(First Embodiment)

Figure 1:
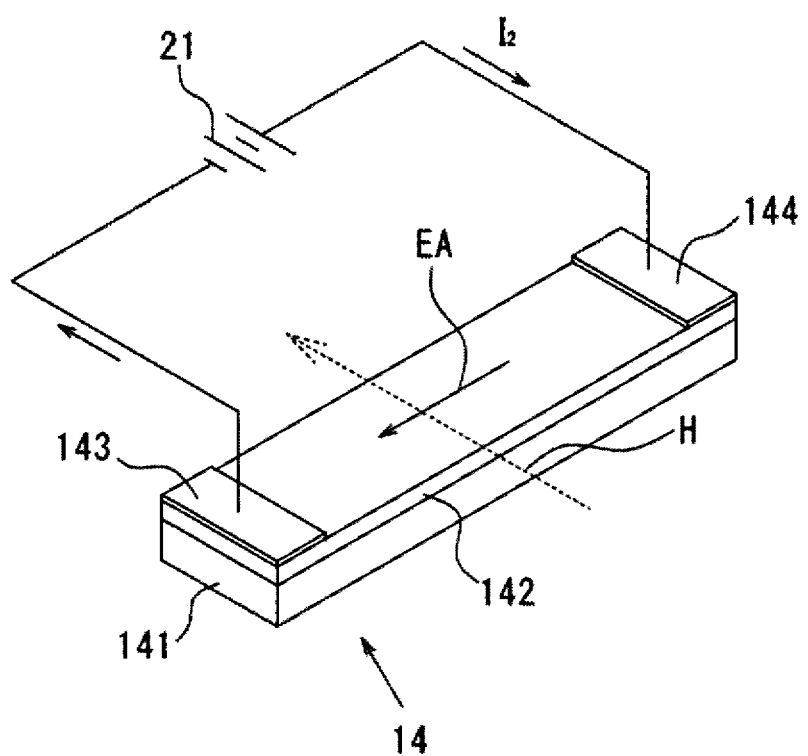
FIG. 1 is a diagram illustrating a configuration of a magnetic element used in the present invention.

First, a magnetic element 14 used in the present invention will be briefly described. Referring to FIG. 1, in the magnetic element 14, a magnetic film 142 is formed on a substrate 141, and element terminals (electrode) 143 and 144 are formed on both ends of the magnetic film 142. The element terminals 143 and 144 have a reed shape, and a direction in which the element terminals 143 and 144 are formed is referred to as a "longitudinal direction." It is preferable that a magnetization easy axis EA be inducted in the longitudinal direction in the magnetic film 142.

An electric current $I_2$ flows from a detector power source 21 to the magnetic element 14. The electric current $I_2$ flows through the magnetic film 142 in the longitudinal direction. At this time, when an external magnetic field H is applied in a direction perpendicular to the longitudinal direction, electrical resistance of the magnetic film 142 changes. This is referred to as a "magneto-resistance effect." The magneto-resistance effect is considered to be caused by a change in directions of the electric current $I_2$ flowing through the magnetic film 142 and magnetization in the magnetic film 142. Here, the "external magnetic field H" refers to a magnetic field applied from the outside of the magnetic film 142.

FIG. 2(a) is a plan view illustrating the magnetic element 14 of FIG. 1, and FIG. 2(b) illustrates a relation between the external magnetic field H applied to the magnetic element 14 and a resistance value $R_{mr}$ of the magnetic film 142. A horizontal axis indicates the external magnetic field H applied to the magnetic film 142, and a vertical axis indicates a resistance value (Ω) of the magnetic film 142. The magneto-resistance effect is considered to occur as the direction of the electric current $I_2$ deviates from the direction of the magnetization M and thus has characteristics of an even function on the applied external magnetic field H.

However, when the external magnetic field H is applied in a state in which the external magnetic field H is zero, it is difficult to identify the direction of the external magnetic field H as a change in the resistance value. In this regard, a bias magnetic field Hbias is applied in a direction perpendicular to the longitudinal direction. Due to the bias magnetic field Hbias, an operation point is moved, and the resistance value $R_{mr}$ is increased/decreased depending on the direction of the external magnetic field H. FIG. 2(b) illustrates an example in which the external magnetic field H was applied at the time of a resistance value $R_{m0}$ of the operation point, and a resistance change of $+\Delta R_{mr}$ occurred consequently. A reference numeral MRC is a curved line indicating the magneto-resistance effect.

The bias magnetic field Hbias can be easily applied by a permanent magnet 149. Of course, an electromagnet may be used. As described above, a unit that applies the bias magnetic field Hbias to the magnetic element 14 is referred to as a "biasing unit 145." The biasing unit 145 may not be configured to generate a magnetic field directly.

Figure 3:
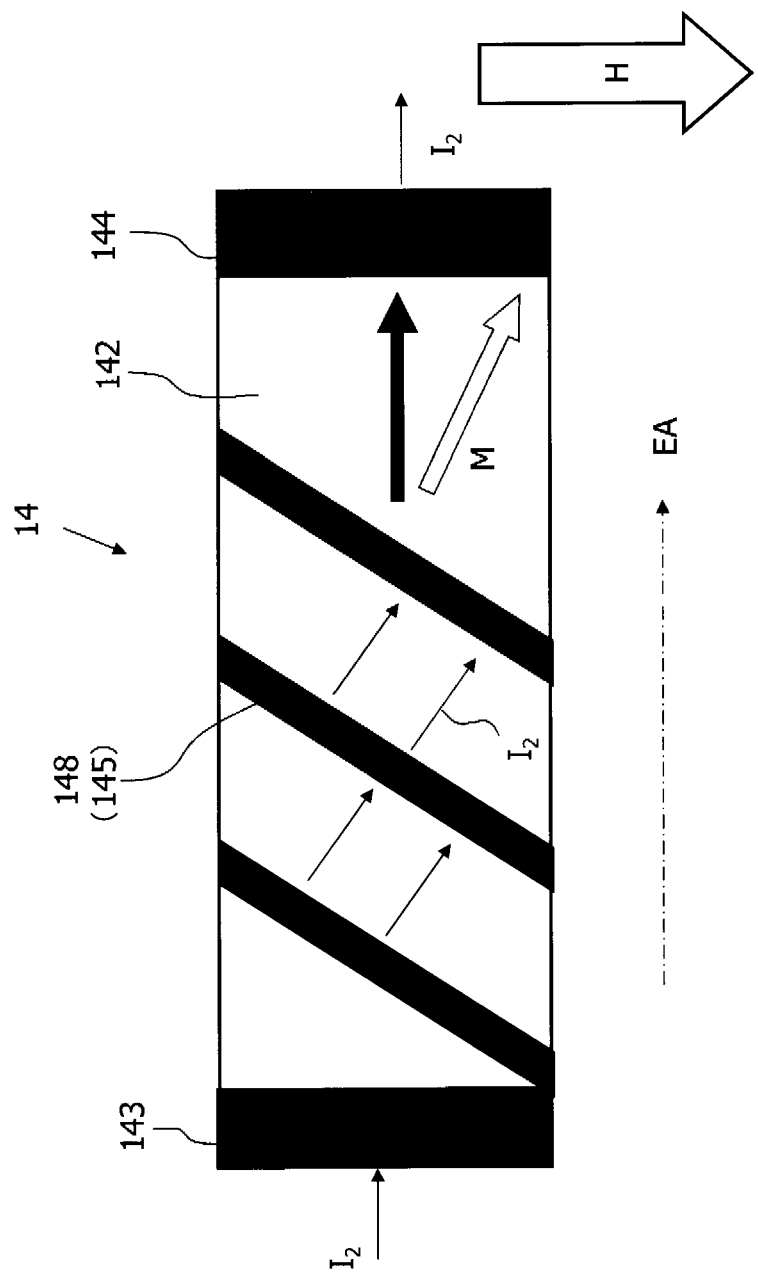
FIG. 3 is a diagram illustrating a magnetic element (barber pole type) including a stripe-shaped conductor pattern.

FIG. 3 illustrates an example in which conductors 148 formed on the magnetic film 142 using an excellent conductive material have a stripe-shaped stripe structure. The stripe structure refers to a structure in which the conductor 148 has a stripe shape and is formed obliquely with respect to the longitudinal direction of the magnetic film 142. It is preferable that the conductors 148 be formed at an equal distance in parallel to each other. In this structure, the electric current $I_2$ flows between stripe-shaped conductors 148 at a shortest distance. In the magnetic film 142, the magnetization easy axis EA is induced in the longitudinal direction of the magnetic element 14. As a result, even in the state in which the external magnetic field H is zero, the direction of the magnetization M differs from the direction of the electric current $I_2$. In other words, the same situation as when the bias magnetic field is applied can be obtained in respect of the magneto-resistance effect.

Figure 2:
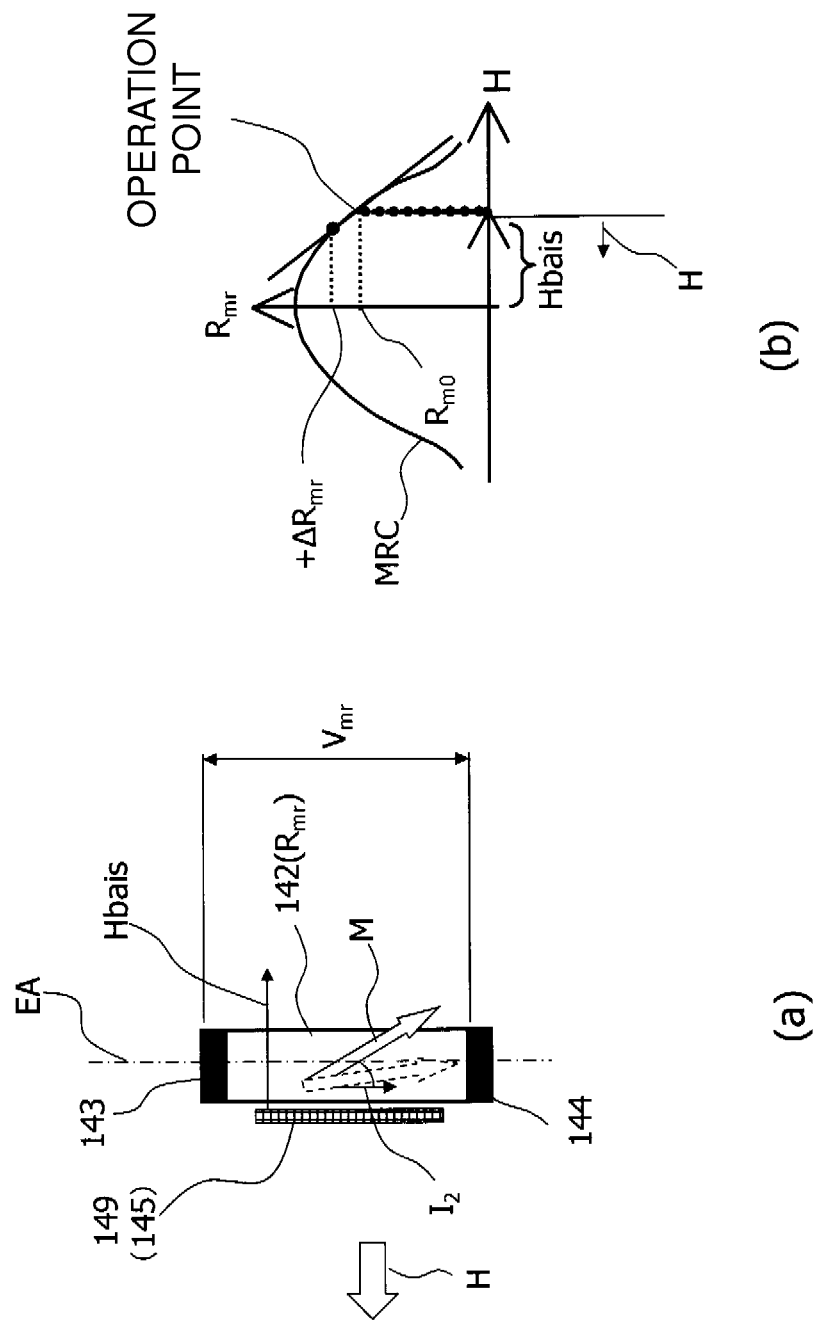
FIGS. 2(a) and 2(b) are diagrams for describing an operation of a magnetic element.

The external magnetic field H (white arrow H) is assumed to have been applied to the magnetic element 14 having this structure downward from a plane of paper. The magnetization M (black arrow) in the state in which there is no external magnetic field H is at an angle different from the electric current $I_2$, but the magnetization M (white arrow) is turned in the same direction as the electric current $I_2$ by the external magnetic field H. A movement of the magnetization M on the electric current $I_2$ is the same movement of the magnetization M described above with reference to FIG. 2, and the resistance value of the magnetic element 14 of FIG. 3 changes as illustrated in FIG. 2(b).

In the present specification, as described above, the biasing unit 145 has a function capable of giving the same effect as when the bias magnetic field Hbias is actually applied even when the magnetic field is not actually being generated. A combination of the conductor 148 and the magnetization easy axis EA illustrated in FIG. 3 serves as the biasing unit 145 as well. The magnetic element 14 having the structure illustrated in FIG. 3 is referred to as a "barber pole type." As another example, the magnetization easy axis EA of the magnetic film 142 may be inducted obliquely from the longitudinal direction. In this case, the direction of magnetization is inclined with respect to the direction (the longitudinal direction) in which an electric current flows in advance.

Figure 4:
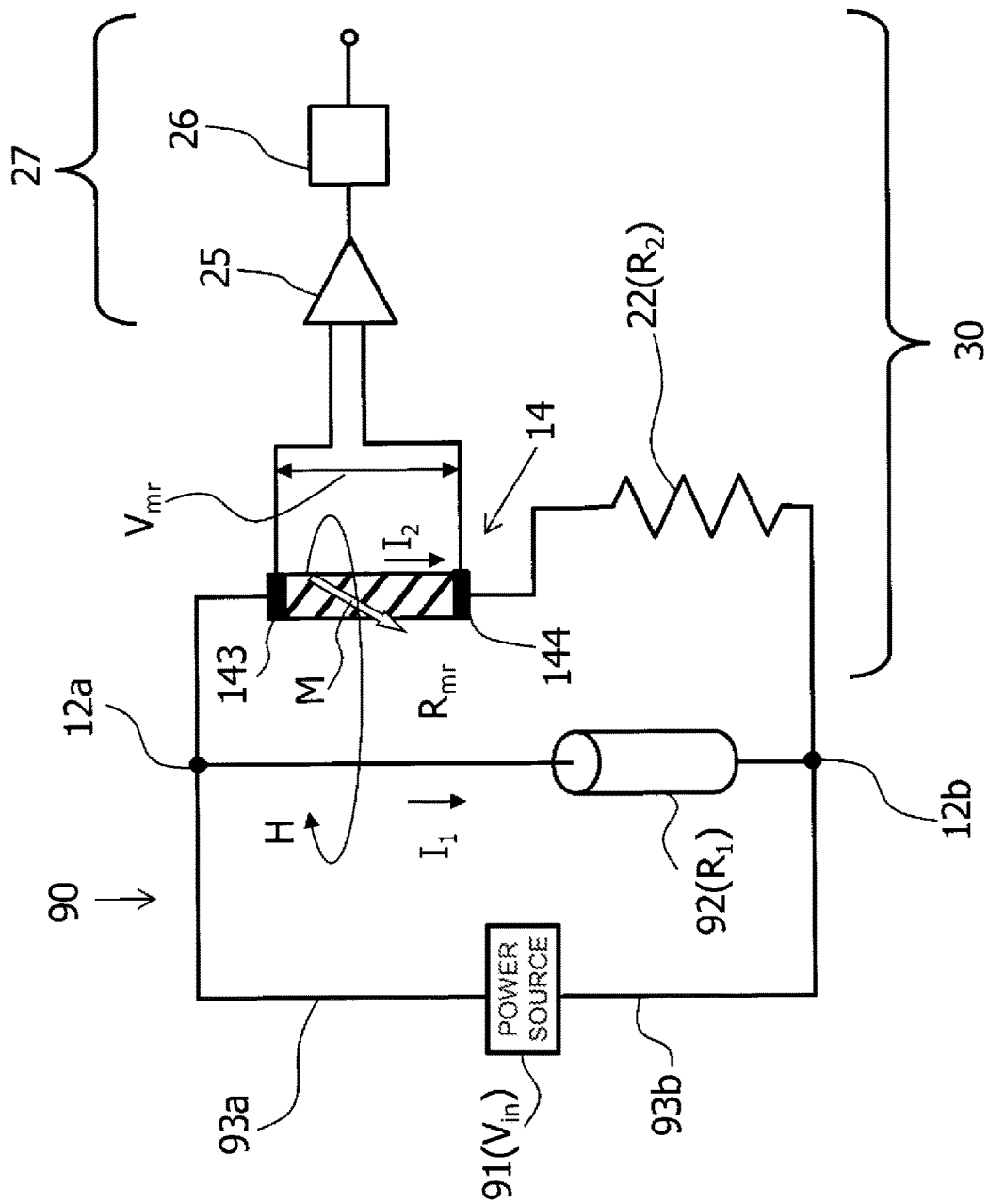
FIG. 4 is a diagram illustrating a configuration of an electrical power measurement device employing a magnetic element.

FIG. 4 illustrates a principal of an electrical power measurement employed by the barber pole type magnetic element 14. The magnetic element 14 is connected with a measurement resistor 22 in series, and connected with a load 92 connected to a power source 91 of a circuit to be measured 90 in parallel. Connection points are connection terminals 12a and 12b. The magnetic element 14 is arranged at an adjacent position in parallel to an electric wire 93a connecting the power source 91 with the load 92. Here, "parallel" means that an in-plane direction of the magnetic element 14 is parallel to a magnetic field concentrically formed around the electric wire 93a. The measurement resistor 22 is configured to have a resistance value sufficiently larger than the resistance value $R_{mr}$ of the magnetic element 14. A resistance of the electric wire 93a is sufficiently small.

First, when the power source 91 is that of direct current, if an electric current flowing through the electric wires 93a and 93b is indicated by $I_1$, the external magnetic field H applied to the magnetic element 14 is expressed as in Formula (1) using α as a constant of proportion:

$$H = \alpha I_1 \quad (1)$$

As illustrated in FIG. 2(b), a change $\Delta R_{mr}$ in the electrical resistance of the magnetic element 14 is in proportion to the magnetic field H applied from the outside, and thus the change $\Delta R_{mr}$ is expressed as in Formula (2) when Formula (1) is considered using β as a constant of proportion.

$$\Delta R_{mr} = \beta H = \beta(\alpha I_1) \quad (2)$$

If an electrical resistance when the external magnetic field H is not applied to the magnetic film 142 (at the operation point) is $R_{m0}$, an electrical resistance $R_m$ of the entire magnetic element 14 when the external magnetic field H is applied is expressed as in Formula (3):

$$R_m = R_{m0} + \Delta R_{mr} = R_{m0} + \alpha \beta I_1 \quad (3)$$

In other words, the magnetic film 142 arranged near the electric wire 93a through which the electric current $I_1$ flows has electrical resistance characteristics of Formula (3). When the electric current $I_2$ is applied to flow between the element terminals 143 and 144 of the magnetic element 14, a voltage $V_{mr}$ between the element terminals 143 and 144 is expressed as in Formula (4):

$$V_{mr} = R_m I_2 = (R_{m0} + \Delta R_{mr})I_2 = (R_{m0} + \alpha \beta I_1)I_2 \quad (4)$$

Then, since the power source 91 is that of direct current, if the voltage $V_{in}$ is indicated by $V_1$, the voltage $V_{in}$ is expressed as in Formula (5). Further, the electric wires 93a and 93b are assumed to have sufficiently small resistance, and the resistance $R_m$ of the magnetic element 14 is assumed to be sufficiently smaller than that of the measurement resistor 22 (the value is $R_2$). If the resistance of the load 92 is indicated by $R_1$, the electric current $I_1$ flowing through the electric wire 93a and the electric current $I_2$ flowing through the magnetic element 14 are expressed as in Formulas (6) and (7), respectively.

In this regard, the voltage $V_{mr}$ between the element terminals 143 and 144 of the magnetic element 14 is expressed as in Formula (8). Further, a relation of $R_{m0} \ll R_2$ was used while Formula (8) is being deformed. $K_1$ indicates a constant of proportion. From a result of Formula (8), a sum of a voltage proportional to electrical power $I_1 V_1$ consumed in the load 92 and a bias voltage at which the electrical resistance $R_{m0}$ at the operation point of the measurement resistor 22 ($R_2$) and the magnetic element 14 is uniquely decided can be obtained between the element terminals 143 and 144 of the magnetic element 14.

[Mathematical Formula 1]

$$V_{in} = V_1 \quad (5)$$

$$I_1 = \frac{V_1}{R_1} \quad (6)$$

$$I_2 = \frac{V_1}{R_2} \quad (7)$$

$$V_{mr} = (R_{m0} + \alpha \beta I_1)I_2 \quad (8)$$
$$= \left(R_{m0} + \alpha \beta \frac{V_1}{R_1}\right)\frac{V_1}{R_2}$$
$$= \frac{R_{m0} V_1}{R_2} + \alpha \beta \frac{V_1}{R_1}\frac{V_1}{R_2}$$
$$\cong K_1 I_1 V_1$$

The above relations are valid even when the power source 91 is that of alternating current. Next, an example in which the power source 91 is that of alternating current, and the load 92 is a reactance will be described. Formulas (1) to (4) have the above-described relations. Since the power source 91 is the AC current, the voltage $V_{in}$ is expressed as in Formula (9) if an amplitude is $V_1$, and an angular frequency is ω. Further, since the load 92 is the reactance in the circuit to be measured 90, the electric current $I_1$ flowing through the load 92 undergoes a phase shift with the power source 91 (the voltage $V_{in}$). The phase shift is indicated by θ. On the other hand, the magnetic element 14 is a common resistor and thus has the same phase as the power source 91 (the voltage $V_{in}$). Thus, the electric currents $I_1$ and $I_2$ are expressed in Formulas (10) and (11).

In this regard, when Formulas (10) and (11) are substituted into Formula (4), Formula (12) is obtained.

[Mathematical Formula 2]

$$V_{in} = V_1 \sin \omega t \quad (9)$$

$$I_1 = \frac{V_1}{R_1}\sin(\omega t - \theta) \quad (10)$$

$$I_2 = \frac{V_1}{R_2}\sin \omega t \quad (11)$$

$$V_{mr} = (R_{m0} + \alpha \beta I_1)I_2 \quad (12)$$
$$= \left(R_{m0} + \alpha \beta \frac{V_1}{R_1}\sin(\omega t - \theta)\right)\frac{V_1}{R_2}\sin \omega t$$
$$= \frac{R_{m0} V_1}{R_2}\sin \omega t + \alpha \beta \frac{V_1}{R_1}\sin(\omega t - \theta)\frac{V_1}{R_2}\sin \omega t$$
$$= \frac{R_{m0} V_1}{R_2}\sin \omega t + \alpha \beta \frac{V_1}{R_1}\frac{V_1}{R_2}\frac{1}{2}\{\cos \theta - \cos(2\omega t - \theta)\}$$
$$= \frac{R_{m0} V_1}{R_2}\sin \omega t - \alpha \beta \frac{V_1}{R_1}\frac{V_1}{R_2}\frac{1}{2}\cos(2\omega t - \theta) + \alpha \beta \frac{V_1}{R_1}\frac{V_1}{R_2}\frac{1}{2}\cos \theta$$
$$= AC\,componet + K_2 I_1 V_1 \cos \theta$$

Referring to Formula (12), it is understood that effective electrical power consumed in the load 92 is represented as the direct-current component in the last term. In other words, a direct-current voltage obtained by causing an output between the element terminals 143 and 144 to pass through a low pass filter is a voltage proportional to effective electrical power consumed in the load 92. As described above, using the magnetic element 14, it is possible to measure power consumption in the load 92 connected to the power source 91 by a connection method as well as an electric current flowing through the electric wire 93 serving as a power line.

As described above, in the configuration of FIG. 4, regardless of whether the power source 91 is that of direct current or alternating current, it is possible to extract the electrical power consumed in the load 92 connected to the power source 91 as a voltage. A unit that detects a voltage between the element terminals 143 and 144 of the magnetic element 14, removes a direct-current bias component or an AC component, and detects a voltage proportional to the power consumption of the load 92 is referred to as a "detecting means 27." The detecting means 27 is configured with a differential amplifier 25 and a post-processing unit 26.

The post-processing unit 26 is a unit that removes an AC current or a direct-current bias voltage when the AC current or the direct-current bias voltage is superimposed on an output of the differential amplifier 25. Specifically, the post-processing unit 26 can be implemented in a constant voltage power source, a battery, or the like through the low pass filter when the AC current is superimposed, the low pass filter and a unit of applying a voltage having the same absolute value but different polarity when the direct-current bias voltage is superimposed.

Further, a portion of extracting a voltage proportion to the electrical power consumed in the load 92 from the magnetic field generated by the electric wire 93a of the circuit to be measured 90 is referred to as a "sensor part 30." The sensor part 30 may include the differential amplifier 25 and the post-processing unit 26. In FIG. 4, the sensor part 30 is configured with the magnetic element 14, the measurement resistor 22, the differential amplifier 25, and the post-processing unit 26.

Referring back to FIG. 4, the change in the electrical resistance by the magnetic element 14 depends on the applied external magnetic field H. The applied external magnetic field FI is a magnetic field which the electric current flowing through the electric wire 93a in the circuit to be measured 90 generates outside the electric wire 93a. In other words, the accuracy of electrical power measurement depends on an arrangement of the electric wire 93a in which the electrical power is measured and the magnetic element 14. However, since the magnetic element 14 is formed to be thin and small, it is not easy to accurately attach the magnetic element 14 to the electric wire 93a.

Figure 5:
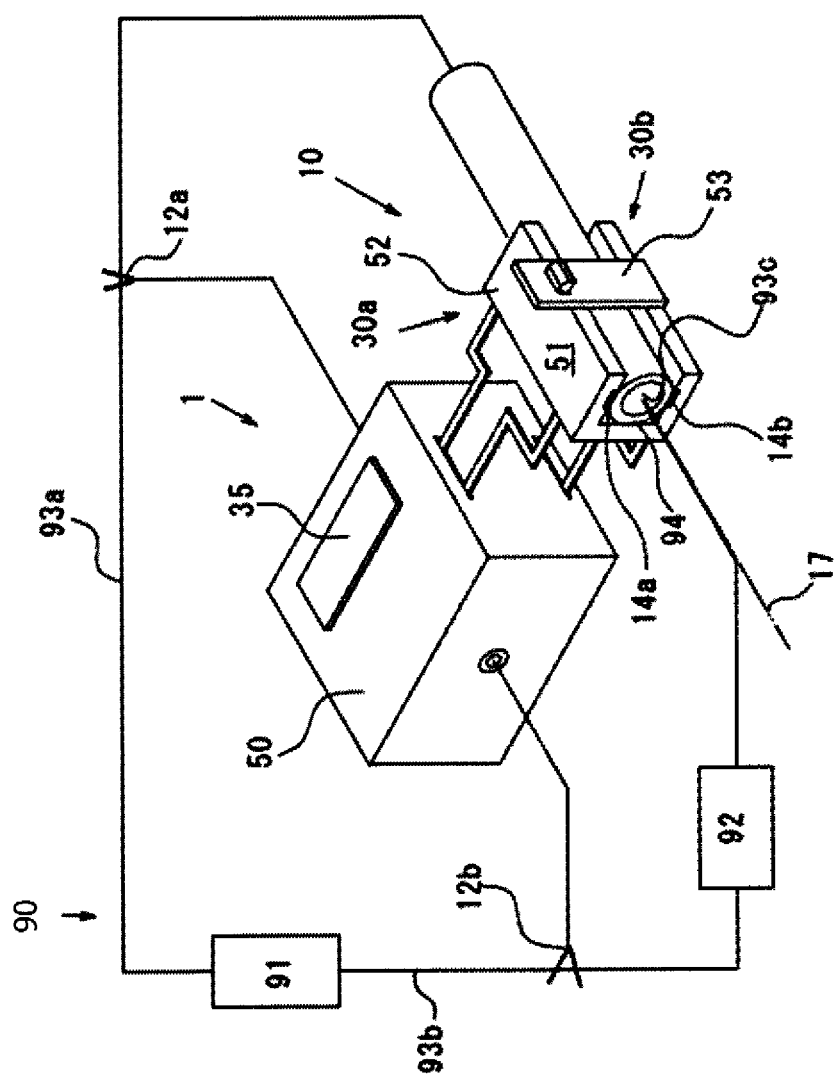
FIG. 5 is a perspective view illustrating an external appearance of an electrical power measurement device according to the present invention.

FIG. 5 illustrates an electrical power measurement device 1 in which an electrical power measurement result is not significantly influenced by the accuracy at which the magnetic element 14 is attached to the electric wire 93a. The circuit to be measured 90 is configured with the power source 91, the electric wire 93a, the load 92, and the electric wire 93b. In the electric wire 93a, some shields 94 and a conducting wire 93c are enlarged and illustrated, and in the remaining portion, the shield 94 is not illustrated, and the conducting wire 93c is represented by a line.

The electrical power measurement device 1 includes a sensor unit 10 arranged on the electric wire 93a and the connection terminals 12a and 12b connected with the circuit to be measured 90. The sensor unit 10 includes a plurality of sensor parts 30, and in FIG. 5, the sensor unit 10 is configured with two sets of sensor parts 30a and 30b. The differential amplifier 25 and the circuit portion such as a wire connection are stored in a housing 50. The connection terminals 12a and 12b are also connected to the inside of the housing 50.

A holder 51 including a frame 52 formed to have a cross section of a laid latter U shape and a stopper 53 closing at least apart of an aperture plane is connected with the housing 50 by a wire connection. Further, magnetic elements 14a and 14b of the sensor parts 30a and 30b are arranged on opposite inner walls of the frame 52. Here, a virtual axis 17 in which the magnetic element 14a and the magnetic element 14b are in a positional relationship of axial symmetry can be considered. In other words, the magnetic element 14a and the magnetic element 14b are arranged at equal distance positions from the virtual axis 17 to face the virtual axis 17. Further, the magnetic element 14a and the magnetic element 14b may be arranged at equal distance positions from the virtual axis 17 to surround the virtual axis 17.

In terms of this meaning, the frame 52 is a fixing means that fixes the magnetic element 14a and the magnetic element 14b at equal distance positions from the virtual axis. Further, the frame 52 fixes the magnetic element 14a and the magnetic element 14b in a direction opposite to the virtual axis 17. When the electric wire 93a is arranged in the frame 52 so that the center of the electric wire 93a overlaps the virtual axis of the frame 52, the magnetic elements 14a and 14b are arranged at equal distance positions from the center of the electric wire 93a.

It is preferable that the electric wire 93a be arranged so that the center thereof overlaps the virtual axis 17 between the magnetic element 14a and the magnetic element 14b. It is because the same magnetic field can be applied to the magnetic elements 14a and 14b. However, for example, if a foreign substance is interposed or if a space is formed between the magnetic elements 14a and 14b when the holder 51 is attached to the electric wire 93a, there are cases in which the center of the electric wire 93a is not arranged to overlap the virtual axis 17.

As described above, if the positional relationship between the magnetic element 14 and the electric wire 93a is not an expected positional relationship, measured power consumption has an error. It is because the power consumption can be obtained by detecting the change in the magnetic field generated by the electric wire 93a through the magnetic element 14.

Meanwhile, when a plurality of magnetic elements 14 are arranged around the electric wire 93a, it is possible to reduce influence on an electrical power measurement result by the position of the electric wire 93a with respect to the magnetic element 14a and the magnetic element 14b. The principal is described below.

Figure 6:
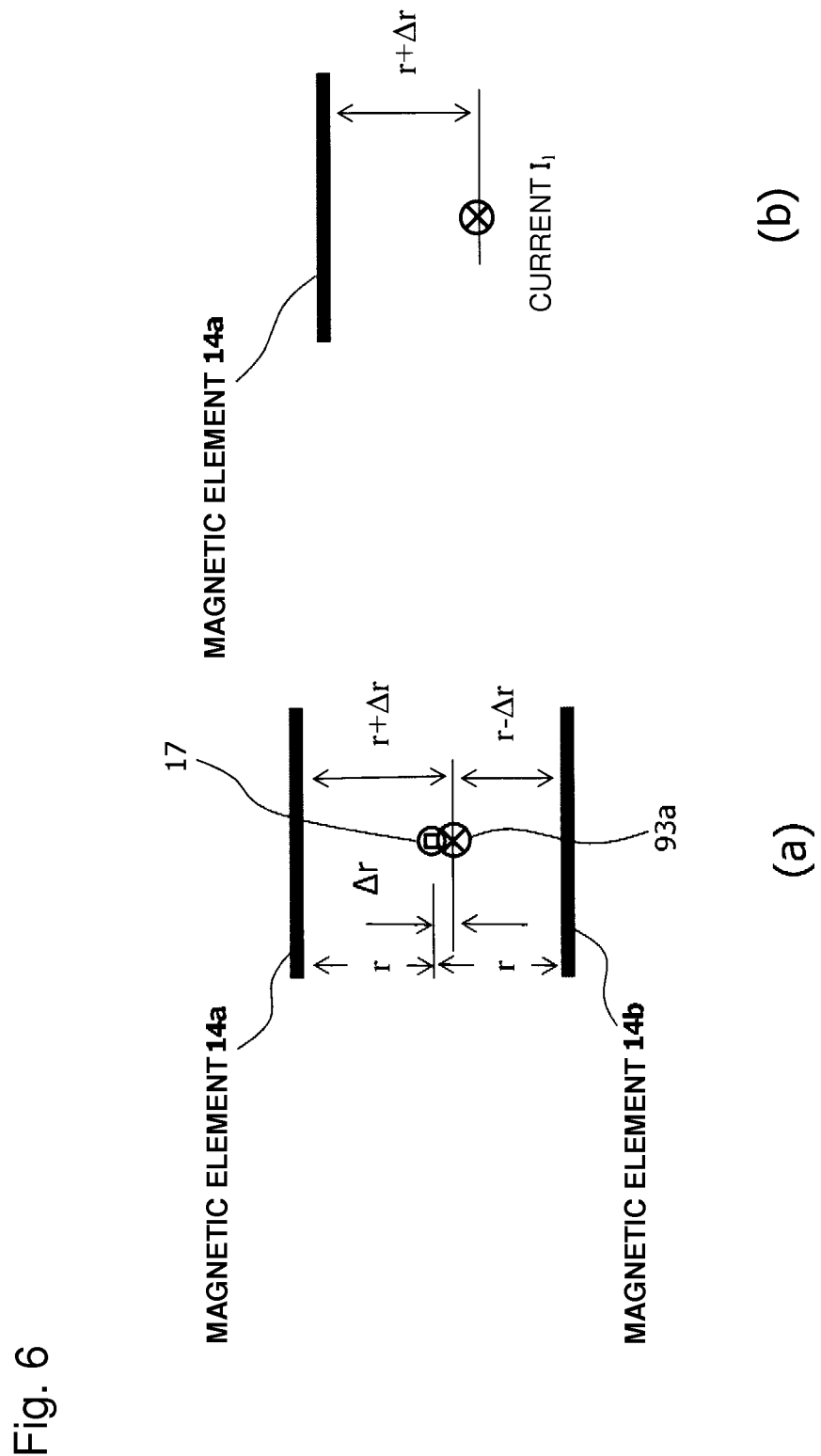
FIGS. 6(a) and 6(b) are diagrams illustrating an arrangement relation between a magnetic element and an electric wire.

FIG. 6(a) illustrates a cross-section state of the magnetic elements 14a and 14b, the virtual axis 17, and the electric wire 93a arranged to overlap the virtual axis 17. It may be called a cross section of the holder 51 in which the electric wire 93a is arranged. The magnetic element 14a is called a magnetic element A, and the magnetic element 14b is called a magnetic element B in order to distinguish a magnetic field, a resistance, a voltage, or the like using "A" and "B."

An interval between the magnetic element 14a and the magnetic element 14b is 2 r, and a deviation of the electric wire 93a from the virtual axis 17 is Δr. In other words, the case in which the electric wire 93a is arranged to overlap the virtual axis 17, but the electric wire 93a deviates from the virtual axis 17 by Δr is illustrated. As a result, the electric wire 93a is at a distance of r+Δr from the magnetic element 14a and at a distance of r−Δr from the magnetic element 14b.

At this time, a magnetic field HA and a magnetic field $H_B$ formed in the magnetic element 14a and the magnetic element 14b are expressed as in Formulas (13) and (14) according to Ampere's circuital law. Since changes $\Delta R_{mrA}$ and $\Delta R_{mrB}$ in electrical resistances of the magnetic elements 14a and 14b are proportional to the magnetic field H applied from the outside, the changes $\Delta R_{mrA}$ and $\Delta R_{mrB}$ are expressed as in Formulas (15) and (16) in view of Formulas (13) and (14) using β as a constant of proportion. $\Delta R_{mrA}$ indicates a resistance change of the magnetic element 14a, and $\Delta R_{mrB}$ indicates a resistance change of the magnetic element 14b.

Further, when the same electric current $I_2$ are applied to flow through the magnetic element 14a and the magnetic element 14b, a voltage $\Delta V_{mrA}$ and a voltage $\Delta V_{mrB}$ corresponding to a resistance change are expressed as in Formulas (17) and (18). $\Delta V_{mrA}$ indicates a voltage change of the magnetic element 14a, and $\Delta V_{mrB}$ indicates a voltage change of the magnetic element 14b.

[Mathematical Formula 3]

$$H_A = \frac{I_1}{2\pi(r+\Delta r)} \tag{13}$$

$$H_B = \frac{I_1}{2\pi(r-\Delta r)} \tag{14}$$

$$\Delta R_{mrA} = \beta H_A = \frac{\beta I_1}{2\pi(r+\Delta r)} \tag{15}$$

$$\Delta R_{mrB} = \beta H_B = \frac{\beta I_1}{2\pi(r-\Delta r)} \tag{16}$$

-continued $$\Delta V_{mrA} = \Delta R_{mrA} \cdot I_2 = \frac{\beta I_1 I_2}{2\pi(r + \Delta r)} \quad (17)$$

$$\Delta V_{mrB} = \Delta R_{mrB} \cdot I_2 = \frac{\beta I_1 I_2}{2\pi(r - \Delta r)} \quad (18)$$

Here, the voltage $\Delta V_{mrA}$ and the voltage $\Delta V_{mrB}$ are added as in Formula (19).

[Mathematical Formula 4]

$$\begin{aligned}\Delta V_{mrA} + \Delta V_{mrB} &= \frac{I_1}{2\pi}\left(\frac{1}{(r+\Delta r)} + \frac{1}{(r-\Delta r)}\right)\beta I_2 \\ &= \frac{I_1}{2\pi}\frac{r+\Delta r + r - \Delta r}{(r+\Delta r)(r-\Delta r)}\beta I_2 \\ &= \frac{I_1}{2\pi}\frac{2r}{r^2 - (\Delta r)^2}\beta I_2 \\ &= \frac{I_1}{2\pi} * \frac{2r}{r^2\left(1 - (\Delta r/r)^2\right)} * \beta I_2 \\ &= 2 * \frac{1}{2\pi r} * \frac{1}{\left(1 - (\Delta r/r)^2\right)} * \beta I_1 I_2 \end{aligned} \quad (19)$$

According to Formula (19), if Δr/r is 0.1 (10%), when the output voltages of the magnetic elements 14a and 14b are added, an output ratio is about 1.01, a variation rate is about 0.01(%), and a variation (error) in a voltage change caused by a variation (error) of an attachment position can be extremely reduced.

Figure 7:
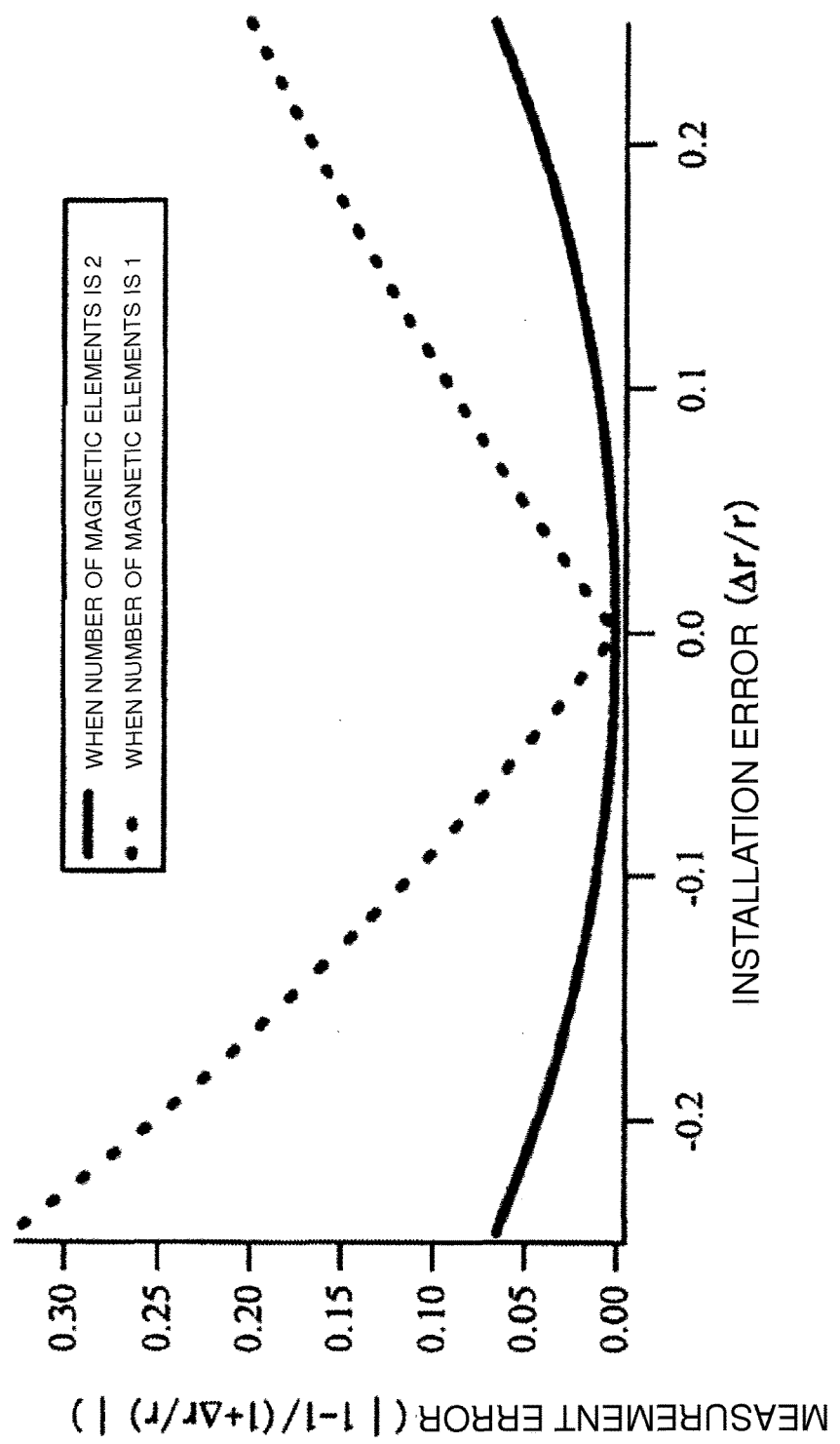
FIG. 7 is a graph illustrating a measurement error when the number of magnetic elements is one and a measurement error when the number of magnetic elements is two.

FIG. 7 is a graph illustrating a relation between an installation error and a measurement error when the electric wire 93a is arranged on the virtual axis 17 of the magnetic element 14a and the magnetic element 14b and when only the magnetic element 14a is arranged for the electric wire 93a. A horizontal axis indicates an installation error (Δr/r), and a vertical axis indicates a measurement error (|1−1/(1+Δr/r)|). In other words, the vertical axis indicates an absolute value of a fractional part of Formula (19). Further, when only the magnetic element 14a is arranged, only the voltage $\Delta V_{mrA}$ is obtained in Formula (19). FIG. 6(b) illustrates a specific configuration thereof.

Referring to FIG. 7, when the electric wire 93a is arranged to overlap the virtual axis 17 of the magnetic elements 14a and 14b, the measurement error can be suppressed to be smaller than when only the magnetic element 14a is arranged.

The positional deviation between the electric wire 93a and the magnetic element 14a and the magnetic element 14b in the distance direction has been described so far. Next, the positional deviation in the width direction of the magnetic element 14a and the magnetic element 14b will be described.

Figure 8:
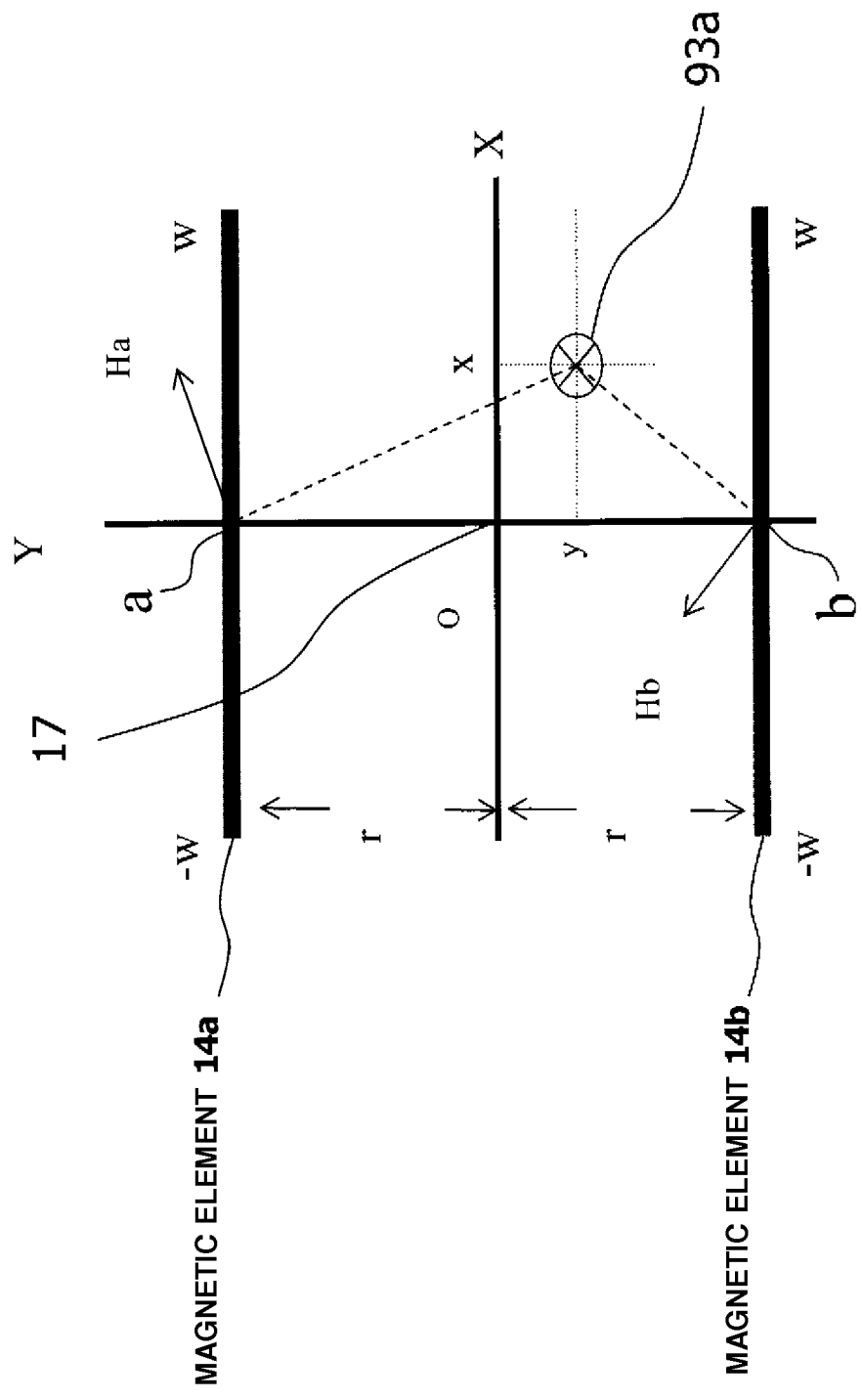
FIG. 8 is a diagram illustrating an arrangement relation (an X coordinate and a Y coordinate) between a magnetic element and an electric wire.

FIG. 8 is a cross-sectional view illustrating the electric wire 93a and the magnetic element 14a and the magnetic element 14b, similarly to FIG. 6(a). In FIG. 8, a direction along the magnetic element width center in the distance direction of the magnetic element 14a and the magnetic element 14b is a Y axis, and the width direction of the magnetic element 14a and the magnetic element 14b perpendicular to the Y axis is an X axis. When the coordinate axes are defined as described above, an original point is the virtual axis 17.

The X axis is a set of points exactly at a distance r from the magnetic element 14a and the magnetic element 14b. A position at which the electric wire 93a is located is represented by coordinates (x, y) in the coordinates, and the magnetic field at central points (points a and b) of the magnetic elements 14a and 14b when the position of the electric wire 93a is varied was calculated. The width of the magnetic elements 14a and 14b is indicated by 2 w.

Figure 9:
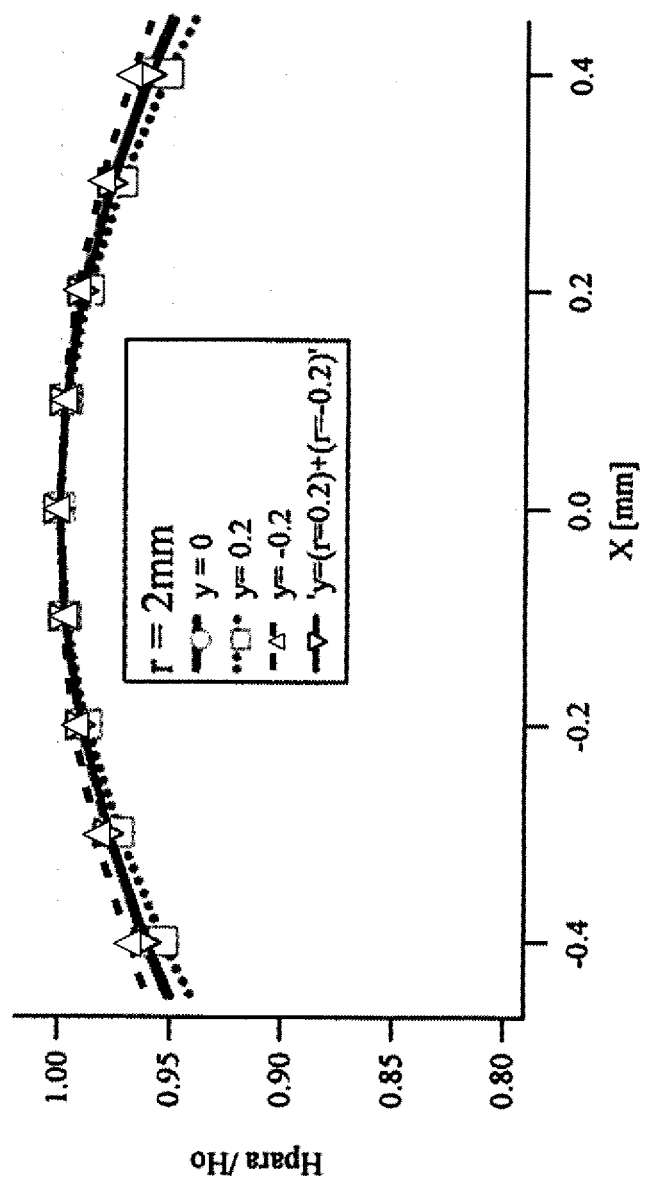
FIG. 9 is a graph illustrating influence on an electrical power measurement result when an electric wire deviates in an X direction.

FIG. 9 illustrates a calculation result. A distance between the magnetic elements 14a and 14b was set to 4 mm (r=2 mm). In FIG. 9, ○ (a white circle) indicates the magnitude (Hpara) of the magnetic field at the point a in the X axis direction when the electric wire 93a (the electric current) is moved horizontally on the straight line (the X axis) of y=0, and □ (a white square) indicates the magnitude (Hpara) of the magnetic field at the point a in the X axis direction when the electric wire 93a (the electric current) is moved horizontally on the straight line (the X axis) of y=0.2 mm, and Δ (a white triangle) indicates the magnitude (Hpara) of the magnetic field at the point a in the X axis direction when the electric wire 93a (the electric current) is moved horizontally on the straight line (the X axis) of y=−0.2 mm. Further, ∇ (a white inverted triangle) indicates the magnitude of the magnetic field obtained by averaging □ (y=0.2 mm) and Δ (y=−0.2 mm).

An amount of change (an amount of movement) on the X axis was set to ±20% (±0.4 mm) in view of the distance r (=2 mm) from the center (the virtual axis 17) to the magnetic elements 14a and 14b and an upper and lower variation widths of 0% to 20%. In FIG. 9, the y axis values are standard values (Hpara/Ho) of the magnetic fields Ho (y=0), Ho (y=0.2), and Ho (y=−0.2) when the positions of the electric wire 93a (the electric current) are (x=0, y=0), (x=0, y=0.2), and (x=0, y=−0.2). In FIG. 9, a horizontal axis indicates the X axis, and a vertical axis indicates the magnetic field in the X axis direction using the standard value (Hpara/Ho).

It is understood from FIG. 9 that the external magnetic field in the X axis direction is reduced by about 1% with respect to the variation of 10% (±0.2 mm) in the X axis direction, and the external magnetic field in the X axis direction is reduced by about 4% with respect to the variation of 20% (±0.4 mm) in the X axis direction. However, it is understood that even when the electric wire 93a (the electric current) is horizontally moved (has an installation error or vibrates) at an adjacent position (x=0, y=0) to the center (the virtual axis 17) of the magnetic element 14a and the magnetic element 14b, the magnitude of the magnetic field near the center of the magnetic elements 14a and 14b does not significantly vary accordingly.

It is possible to reduce the influence of the positional error between the magnetic element 14 and the electric wire 93a on the electrical power measurement value by arranging the magnetic elements 14a and 14b at the axial symmetric positions to the virtual axis 17, arranging the electric wire 93a of the circuit to be measured 90 to overlap the virtual axis 17, and adding the voltage changes by the magnetic elements 14a and 14b. In other words, it is possible to reduce the error related to the electrical power measurement by interposing the electric wire 93a between the magnetic element 14a and the magnetic element 14b.

As described above, it is necessary to add outputs having the same characteristics as the outputs of the magnetic element 14a and the magnetic element 14b. Therefore, when the electric wire 93a is interposed, the biasing units of the magnetic element 14a and the magnetic element 14b (represented by 145a and 145b, respectively, which are not illustrated) need to be formed to work on the external magnetic field H generated by the electric wire 93a in the same direction.

Figure 10:
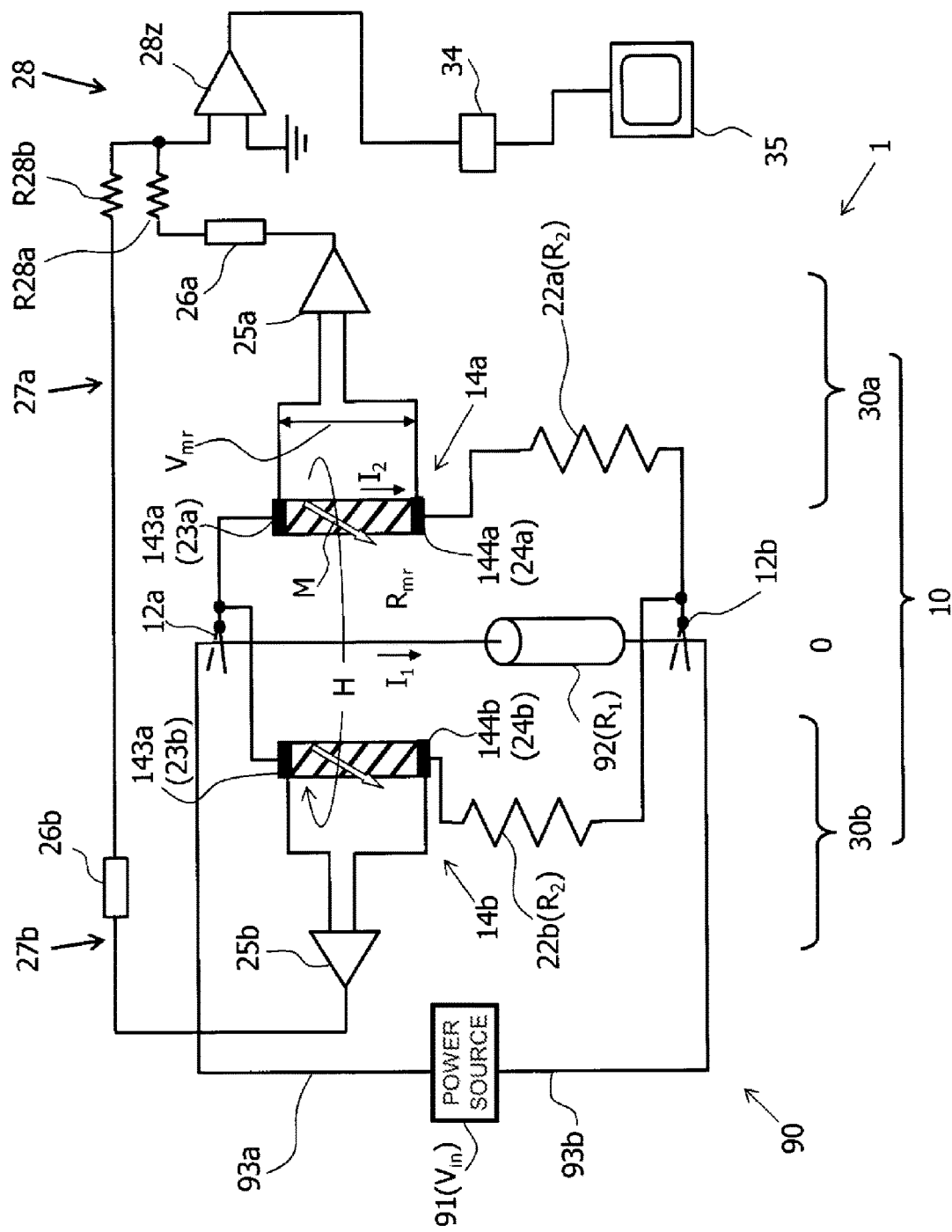
FIG. 10 is a diagram illustrating a wire connection diagram of an electrical power measurement device according to a first embodiment.

FIG. 10 illustrates a specific wire connection relation of the respective components of the electrical power measurement device 1 illustrated in FIG. 5. Specifically, the two set of magnetic elements 14 of the electrical power measurement device illustrated in FIG. 4 are arranged in parallel, and the outputs of the magnetic elements 14 are added through an addition means.

First, the electrical power measurement device 1 includes a first sensor part 30a, a second sensor part 30b, and an addition means 28. A display unit 35 that displays an output of the addition means 28 may be added. The first sensor parts 30a is configured with the magnetic element 14a, the measurement resistor 22a, the differential amplifier 25a, and the post-processing unit 26a, and the second sensor parts 30b is configured with the magnetic element 14b, the measurement resistor 22b, the differential amplifier 25b, and the post-processing unit 26b. The sensor unit 10 is configured with the sensor part 30a and the sensor part 30b.

Referring to FIG. 5, at least the magnetic elements 14a and 14b of the sensor parts 30a and 30b are arranged on the opposite inner walls of the frame 52 having the laid letter U-shaped cross section. The measurement resistors 22a and 22b may be arranged in the frame 52.

Referring back to FIG. 10, voltages are extracted through element terminals 143a, 144a, 143b, and 144b of the magnetic elements 14a and 14b serving as measurement terminals 23a, 24a, 23b, and 24b. The outputs of the measurement terminals 23a, 24a, 23b, and 24b are amplified by the differential amplifiers 25a and 25b, and are converted into a voltage proportional to the power consumption through the post-processing units 26a and 26b. The detecting means 27a and 27b are configured with the differential amplifiers 25a and 25b and the post-processing units 26a and 26b, respectively.

The outputs of the detecting means 27a and 27b are added through the addition means 28. The addition means 28 receives the outputs of the detecting means 27a and 27b through reception resistors R28a and R28b and adds the outputs through an amplifier 28z.

An output of the addition means 28 may be transferred to a control device 34 and displayed through the display unit 35 connected to the control device 34. The display unit 35 is not particularly limited, and a display device having a two-dimensional screen, a liquid crystal displaying a numerical value simply, a digital segment, a chart output (a plotter), or the like can be appropriately used. Further, as display content, power consumption within a predetermined period of time, instantaneous power consumption, or integrated power consumption after a predetermined time may be displayed. The display items are obtained by a predetermined operation by the control device 34 that has received the output of the addition means 28.

The magnetic elements 14a and 14b of the sensor parts 30a and 30b are fixed to the opposite walls (see FIG. 5) of the frame 52. The virtual axis 17 to which the magnetic elements 14a and 14b mutually have positional relationships of axis symmetry is considered, and the center of the electric wire 93a of the circuit to be measured 90 is arranged to overlap the virtual axis 17. Further, the sensor parts 30a and 30b are connected to the power source 91 in parallel to the load 92.

Therefore, to this end, the electrical power measurement device 1 includes the connection terminals 12a and 12b. In other words, the connection terminals 12a and 12b are terminals for connecting the sensor parts 30a and 30b to the power source 91 in parallel to the load 92. The connection terminals 12a and 12b may be removable and may be welded by a solder or the like.

As described above, in the electrical power measurement device 1, since the electric wire 93a of the circuit to be measured 90 is arranged at the position of the virtual axis 17 of a pair of sensor parts 30a and 30b (see FIG. 5), even when the positional relationship between the magnetic elements 14a and 14b and the electric wire 93a deviates slightly, the electrical power measurement result does not include a significant error.

Figure 11:
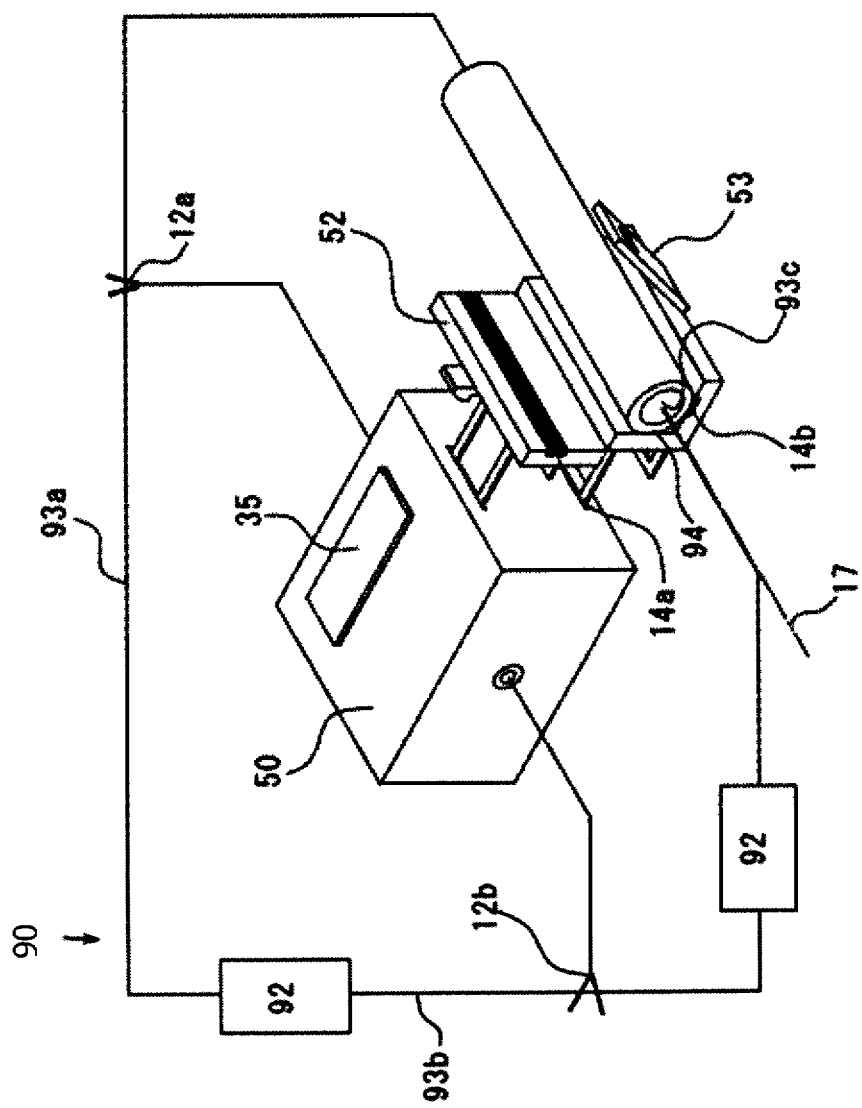
FIG. 11 is a diagram illustrating another shape of a frame.

FIG. 11 illustrates another form of the frame 52 (which may be called the holder 51) serving as the fixing means of the magnetic elements 14a and 14b. The frame 52 may be formed such that at least the side at which the magnetic element 14a is arranged is swingable by a hinge structure. Through this configuration, the magnetic elements 14a and 14b can be easily attached to the electric wire 93a.

(Second Embodiment)

Figure 12:
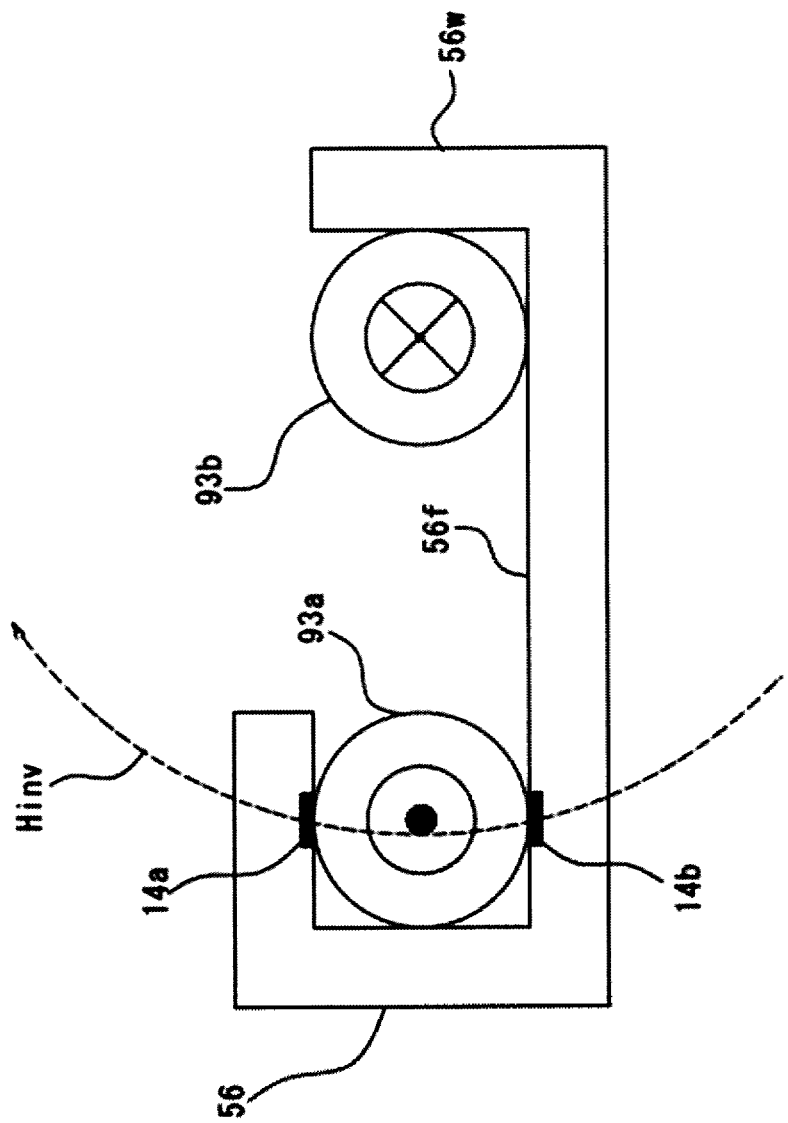
FIG. 12 is a diagram illustrating another shape of a frame.

FIG. 12 is a cross-sectional view illustrating a frame 56 used in an electrical power measurement device 2 according to the present embodiment. The electrical power measurement device 2 is similar to the electrical power measurement device 1 according to the first embodiment except that the frame 56 serving as the fixing means is different. Therefore, an overall configuration is not illustrated. The frame 56 of the electrical power measurement device 2 according to the present embodiment fixes the positional relationship between the electric wire 93b and the magnetic elements 14a and 14b as well as the electric wire 93a of the circuit to be measured 90. In FIG. 12, the electric current $I_1$ flows through the electric wire 93a from the back side of the plane of paper to the front side of the plane of paper, and the electric current $I_1$ flows through the electric wire 93b from the front side of the plane of paper to the back side of the plane of paper.

In the frame 56, one opposite wall having a laid letter U-shaped cross section is extended without change and forms a planar section 56f fixing the electric wire 93b. Further, a fixing wall 56w for easily fixing the position of the electric wire 93b may be formed. Typically, the electric wires 93a and 93b extending from the power source 91 to the load 92 are often arranged as a pair. In this case, the other electric wire 93b is arranged near the magnetic elements 14a and 14b attached to the electric wire 93a used to measure the electrical power. Since the electric current $I_1$ also flows through the electric wire 93b arranged at the adjacent position to the electric wire 93a, a magnetic field Hinv is generated.

The magnetic field Hinv has influence even on the magnetic element 14a and the magnetic element 14b. However, the magnetic elements 14a and 14b are formed in a thin film form, and the magneto-resistance effect is generated by the angle formed between the magnetization M in the longitudinal direction and the electric current $I_2$ flowing in the longitudinal direction. Further, sensitivity of the magneto-resistance effect on the magnetic field applied in the film thickness direction is extremely low. Therefore, by arranging the magnetic elements 14a and 14b so that the magnetic field Hinv from the electric wire 93b arranged at the adjacent position is applied in the film thickness direction of the magnetic elements 14a and 14b, the influence of the magnetic field Hinv can be reduced, and the accuracy of electrical power measurement can be increased.

Since the frame 56 fixes the electric wire 93b in parallel to the electric wire 93a as illustrated in FIG. 12, the magnetic field Hinv generated by the electric wire 93b can be guaranteed to be applied in the close state in the film thickness direction of the magnetic element 14a and the magnetic element 14b. Thus, the accuracy related to the electrical power measurement can be increased.

Figure 13:
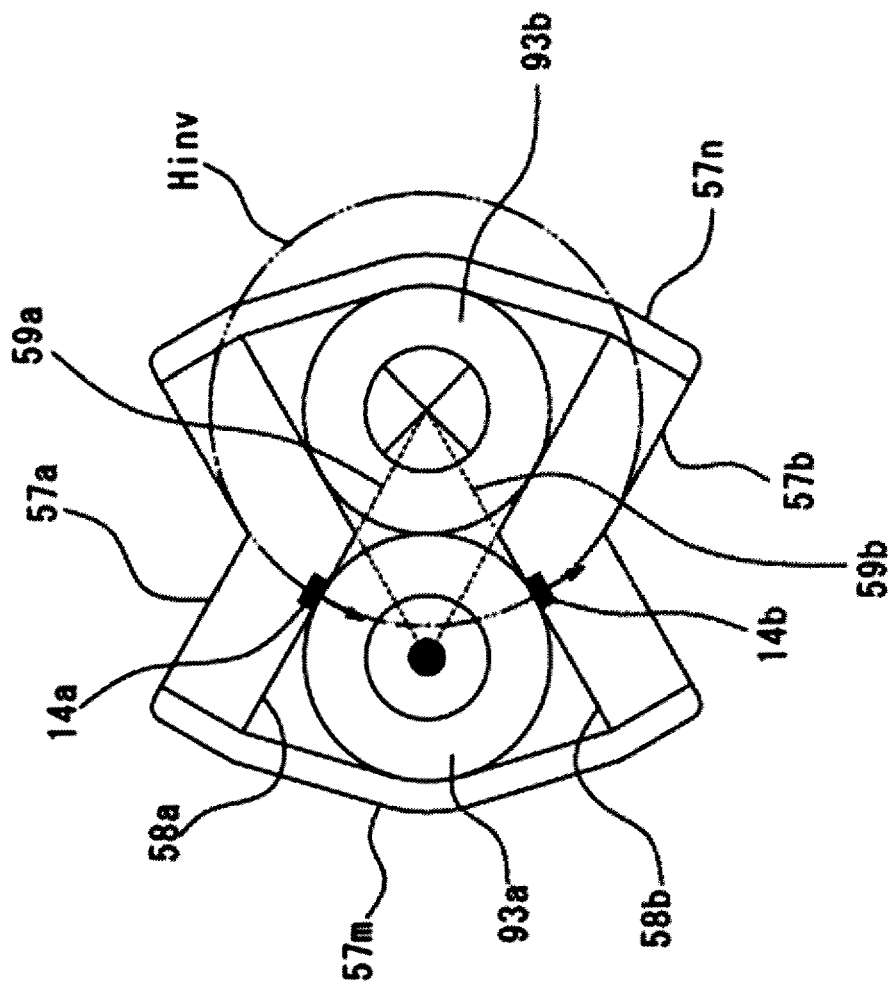
FIG. 13 is a diagram illustrating another shape of a frame.

FIG. 13 illustrates a cross section of a frame 57 capable of fixing a positional relationship in which the magnetic field Hinv generated by the electric wire 93b is applied vertically to the magnetic element 14a and the magnetic element 14b. Similarly to the frame 56, the frame 57 serving as the fixing means is configured with a pair of frame pieces 57a and 57b having a letter V-shaped cross section and binds 57m and 57n connecting the frame pieces 57a and 57b, respectively.

The frame piece 57a and the frame piece 57b are fixed by the binds 57m and 57n such that convex ridge portions having a letter V-shaped cross section are opposite to each other, and inclined planes 58a and 58b extending from the convex ridges are opposite to each other. The electric wire 93a and the electric wire 93b are held in the space formed by the inclined planes 58a and 58b, the binds 57m and 57n, and the convex ridge.

The magnetic element 14a and the magnetic element 14b are arranged on one of the opposite inclined planes of the frame pieces 57a and 57b. The opposite inclined planes 58a and 58b are formed to include tangential lines 59a and 59b extending from the centers of the electric wire 93a and the electric wire 93b to the surface of the other electric wire 93a. Thus, the magnetic field Hinv generated by the electric wire 93b is necessarily in the vertical direction to the inclined planes 58a and 58b. Therefore, the magnetic elements 14a and 14b can be prevented from being influenced by the magnetic field Hinv generated by the electric wire 93b arranged at the adjacent position.

Figure 14:
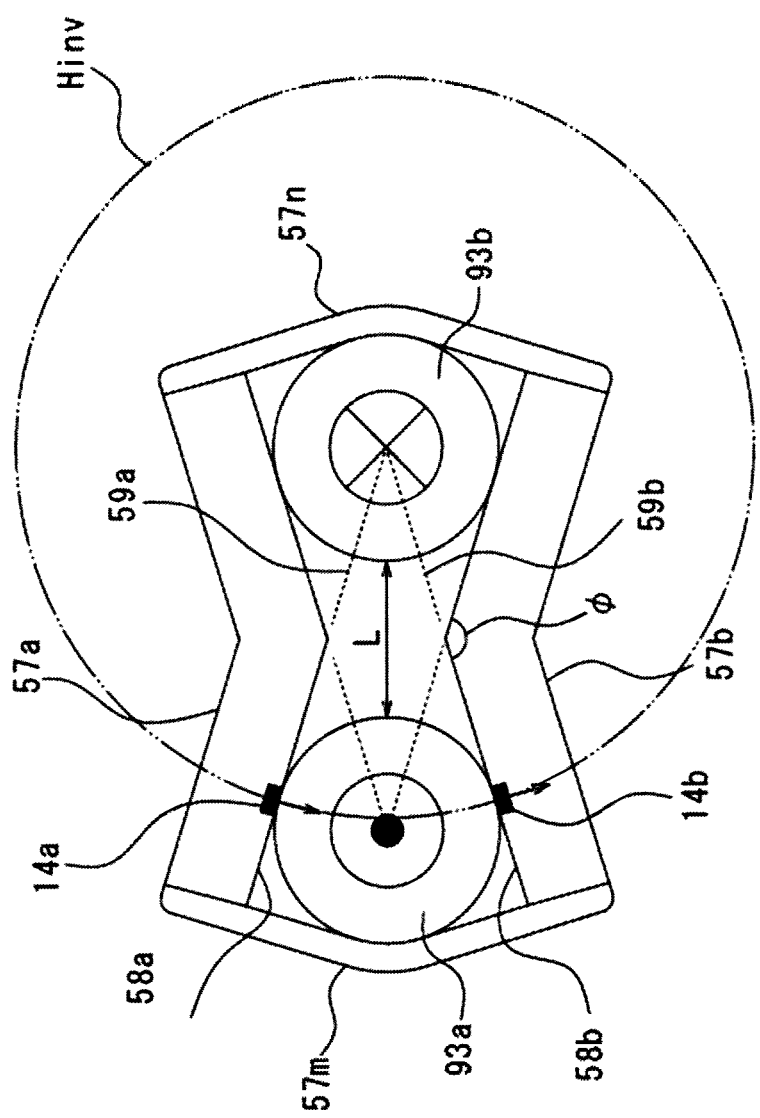
FIG. 14 is a diagram illustrating another shape of a frame.

FIG. 14 illustrates a cross section of the frame 57 when an interval L between the electric wire 93a and the electric wire 93b is increased. When the interval L between the held electric wire 93a and the electric wire 93b is increased as described above, angles θ of the convex ridges of the frame piece 57a and the frame piece 57b are increased.

(Third Embodiment)

In the electrical power measurement device 1 (the wire connection diagram is FIG. 10) according to the first embodiment, the error caused by the arrangement can be reduced by arranging the two magnetic elements 14a and 14b to be opposite to each other, interposing the electric wire 93a of the circuit to be measured 90, and adding the voltage changes of the magnetic elements 14a and 14b. This concept can increase the effects by increasing the number of magnetic elements 14.

Figure 15:
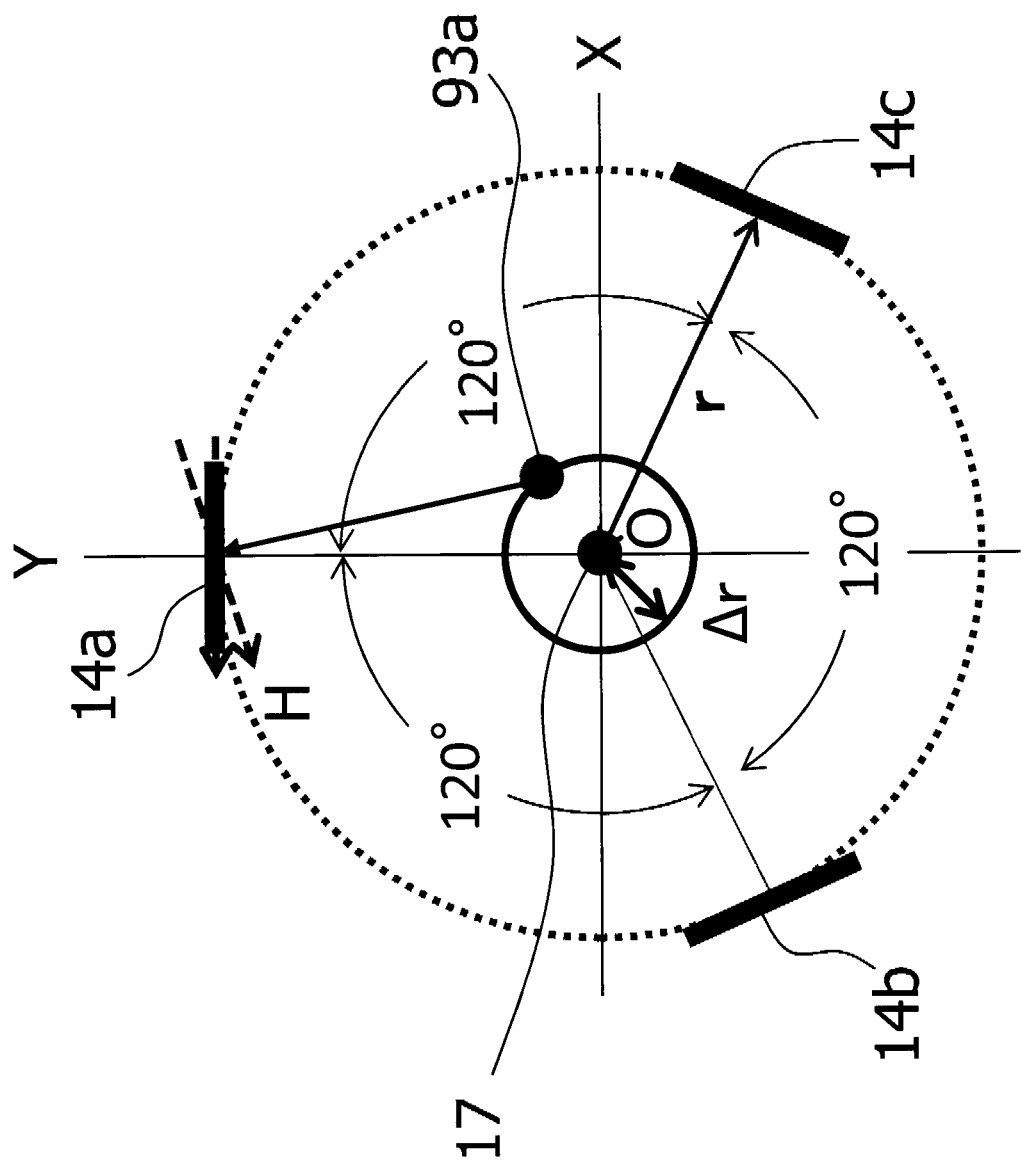
FIG. 15 is a schematic diagram illustrating an arrangement relation of a magnetic element by a frame according to a second embodiment.

FIG. 15 illustrates a cross section of a positional relationship between the magnetic element 14 and the electric wire 93a when the magnetic elements 14 are arranged at three positions around the electric wire 93a. This corresponds to the case in which the holder 51 is formed of a frame having a triangular inner wall. The length of the holder 51 is preferably larger than the length of the magnetic element 14 in the longitudinal direction. The X axis and the Y axis are internally assumed, and one magnetic element 14a is arranged on the Y axis. An original point of the axis is the virtual axis 17.

A magnetic element 14b and a magnetic element 14c are arranged at positions inclined from the Y axis by 120° on a circumference at the distance r from the virtual axis 17. The magnetic elements 14 are adjusted in a direction coming into contact with a circumference of a radius r. The magnetic elements 14 are arranged in a direction facing the virtual axis 17.

Originally, it is preferable that the electric wire 93a be arranged at the position of the virtual axis 17. However, when the holder 51 is attached to the electric wire 93a, the positional relationship between the magnetic element 14 and the electric wire 93a has an error. The electric wire 93a is assumed to be on a circumference at a distance of Δr from the virtual axis 17. Further, an output of the addition means 28 (see FIG. 10) when the electric wire 93a is on the virtual axis 17 is assumed to be a "true value," and an output of the addition means 28 when the electric wire 93a is on a radius Δr is assumed to be an "error value." In this case, the output of the addition means 28 by the electric wire 93a on the radius Δr depends on an angle ϕ from the X axis.

The magnetic elements 14a, 14b, and 14c are assumed to represent three sensor parts 30a, 30b, and 30c, and the addition means 28 is assumed to add outputs of the three sensor parts 30a, 30b, and 30c.

Figure 16:
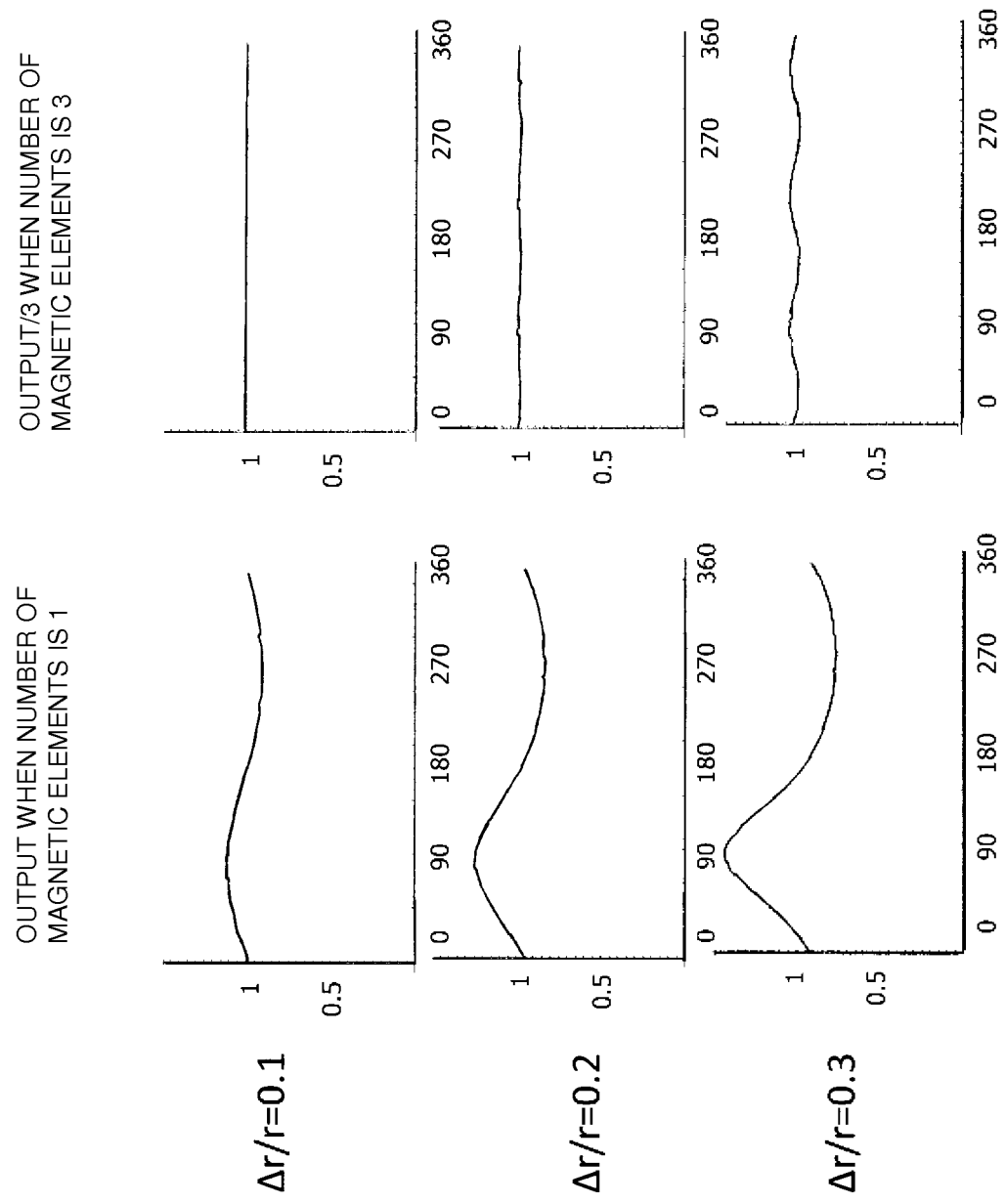
FIG. 16 is a graph illustrating a variation in an electrical power measurement value when three magnetic elements are used.

FIG. 16 illustrates a comparison between an output of the addition means 28 when the number of magnetic elements 14 is one and an output of the addition means 28 when the number of magnetic elements 14 is three. When the number of magnetic elements 14 is three, the output of the addition means 28 is reduced to ⅓ and standardized. A vertical axis indicates an output (a standardized value) of the addition means 28, and a horizontal axis indicates the angle ϕ of the electric wire 93a from the X axis. Values when Δr/r is 0.1, 0.2, and 0.3 are illustrated.

An increase in Δr/r means that the electric wire 93a in the frame 10f is fixed at the position apart from the virtual axis 17. It can be understood that when the number of magnetic elements 14 is three, an output variation is much smaller than when the number of magnetic elements 14 is one.

Figure 17:
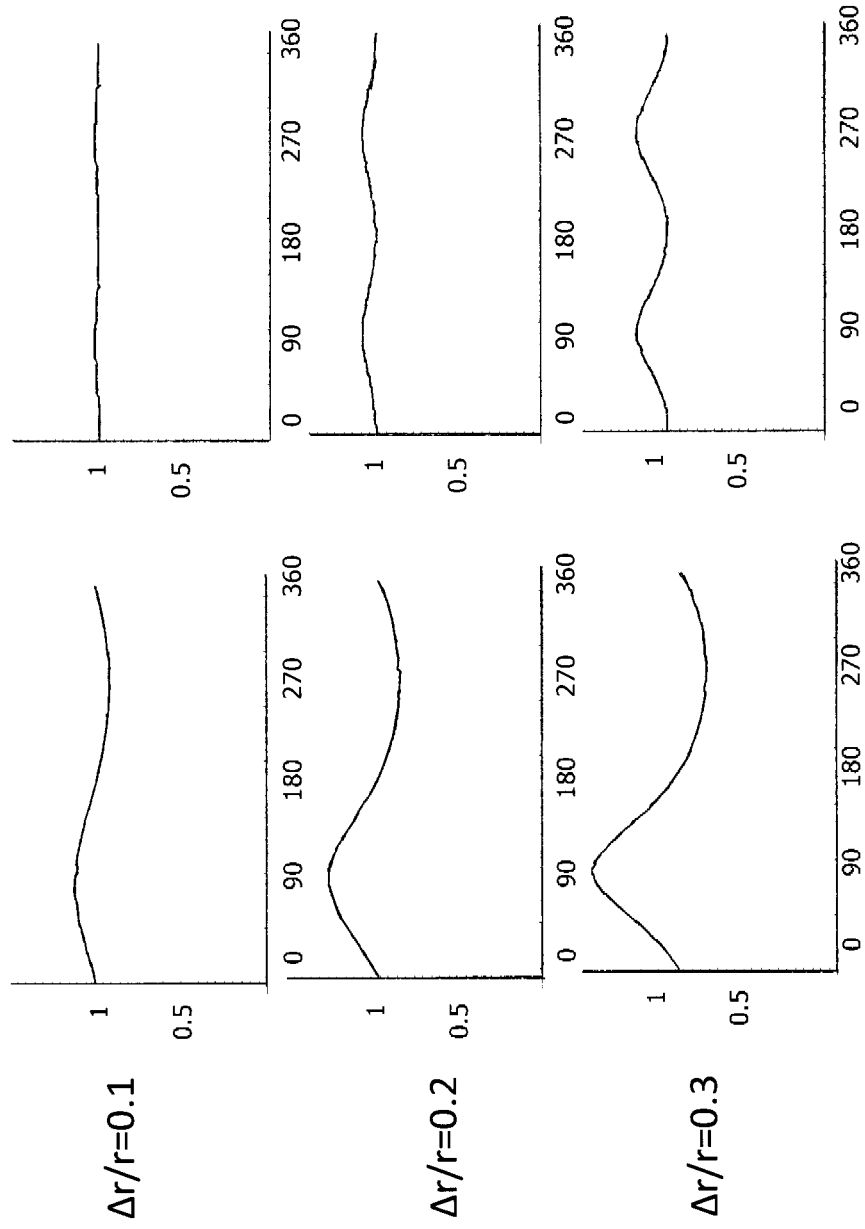
FIG. 17 is a graph illustrating a variation in an electrical power measurement value when two magnetic elements are used.

FIG. 17 illustrates a variation degree of the output of the addition means 28 when the number of magnetic elements 14 is two. When the number of magnetic elements is two, it means that the electric wire 93a is interposed as described above in the first embodiment.

Figure 18:
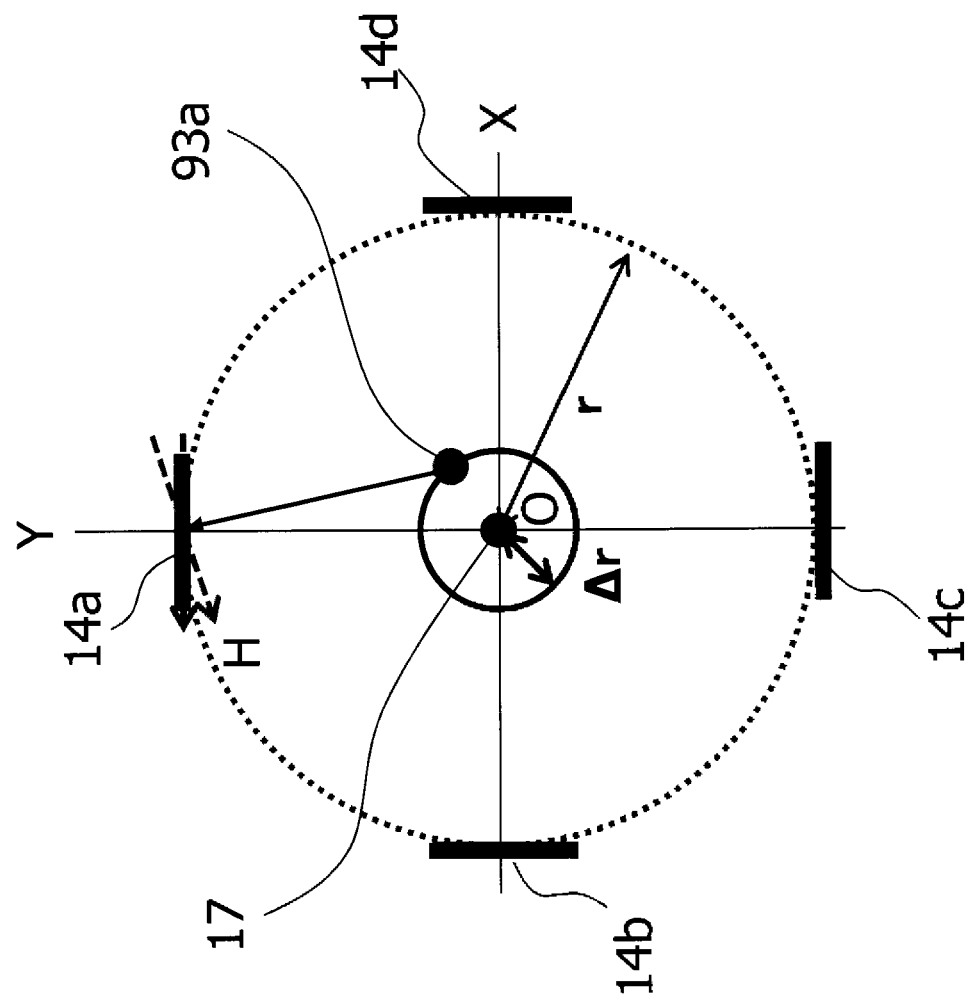
FIG. 18 is a schematic diagram illustrating an arrangement relation of a magnetic element when four magnetic elements are used.

FIG. 18 is a cross-sectional view of a holder 51 illustrating a relation between magnetic elements 14a, 14b, 14c, and 14d and the electric wire 93a when the number of magnetic elements 14 is four. The magnetic elements are components of sensor parts 30a, 30b, 30c, and 30d. When the four magnetic elements 14 are arranged, a holder 51 whose inner wall has a square cross section is used. Similarly to the case in which the number of magnetic elements 14 is three, the X axis and the Y axis are set to an internal space. The virtual axis 17 is the center of a geometrically cross-sectional shape. The magnetic elements 14 are arranged on the X axis and the Y axis. The four magnetic elements 14 are arranged at the position of the equal distance (r) from the virtual axis 17.

Figure 19:
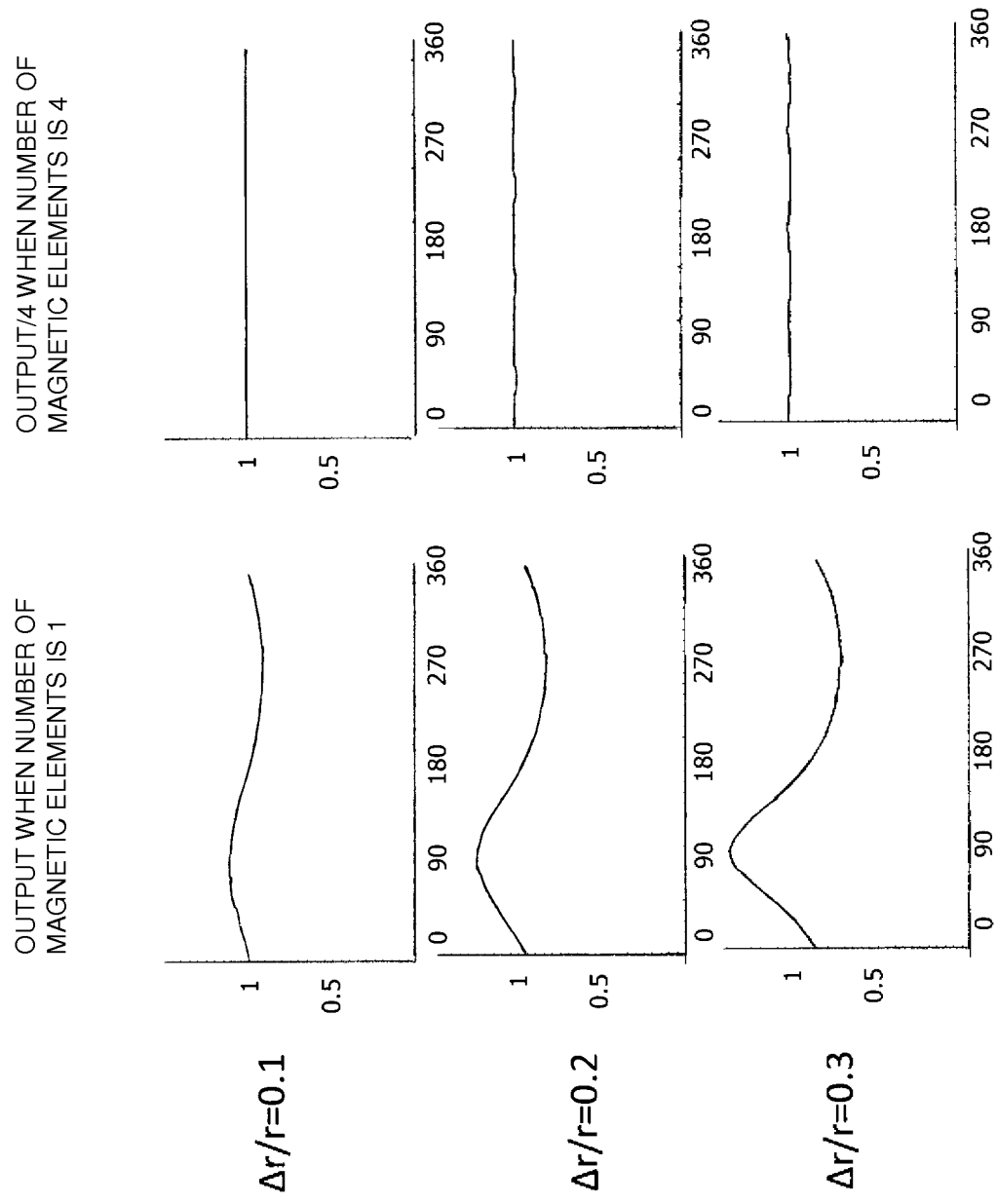
FIG. 19 is a graph illustrating a variation in an electrical power measurement value when four magnetic elements are used.

FIG. 19 illustrates an output result similar to that of FIG. 16 when the number of magnetic elements 14 is four as illustrated in FIG. 18. When the number of magnetic elements 14 is four, the output of the addition means 28 is reduced to ¼ and standardized. It can be understood from FIG. 19 that a variation is suppressed to be smaller than the output of the addition means 28 when the number of magnetic elements is three.

Figure 20:
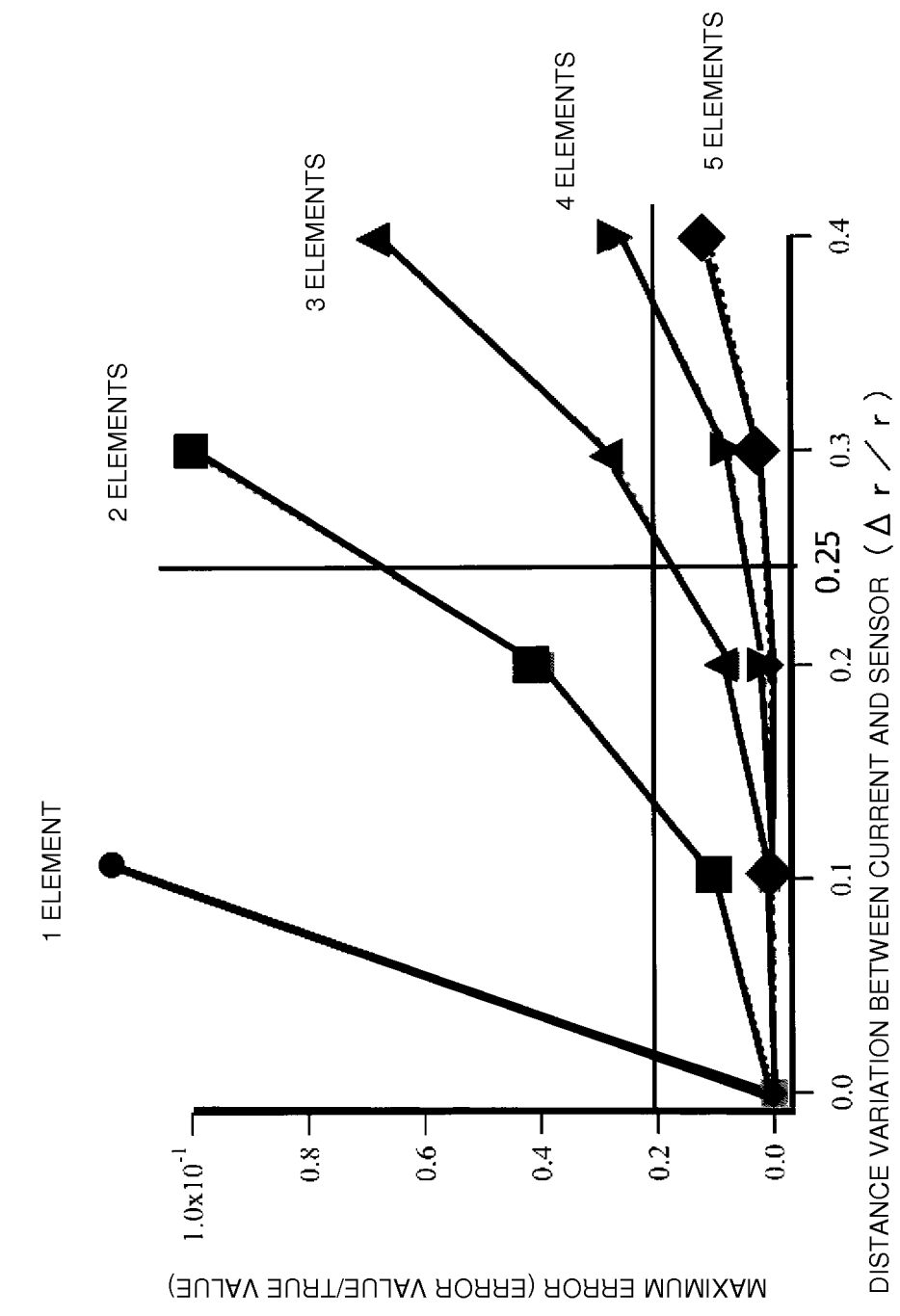
FIG. 20 is a graph illustrating a relation between a deviation of an electric wire 93a from a virtual axis 17 and a maximum error of electrical power measurement.

FIG. 20 illustrates a relation when a horizontal axis indicates Δr/r representing a distance variation between the electric wire 93a and the magnetic element 14, and a vertical axis indicates a maximum error. The maximum error is a value represented by "error value/true value." In the graph, a circle mark indicates when the number of magnetic elements 14 is one, a square indicates when the number of magnetic elements 14 is two, a triangle indicates when the number of magnetic elements 14 is three, and an inverted triangle indicates when the number of magnetic elements 14 is four, and a diamond indicates when the number of magnetic elements 14 is five.

It can be understood from this graph that when three or more magnetic elements 14 are used, even when Δr/r is 0.25, the maximum error can be suppressed to be 2% or less.

Figure 21:
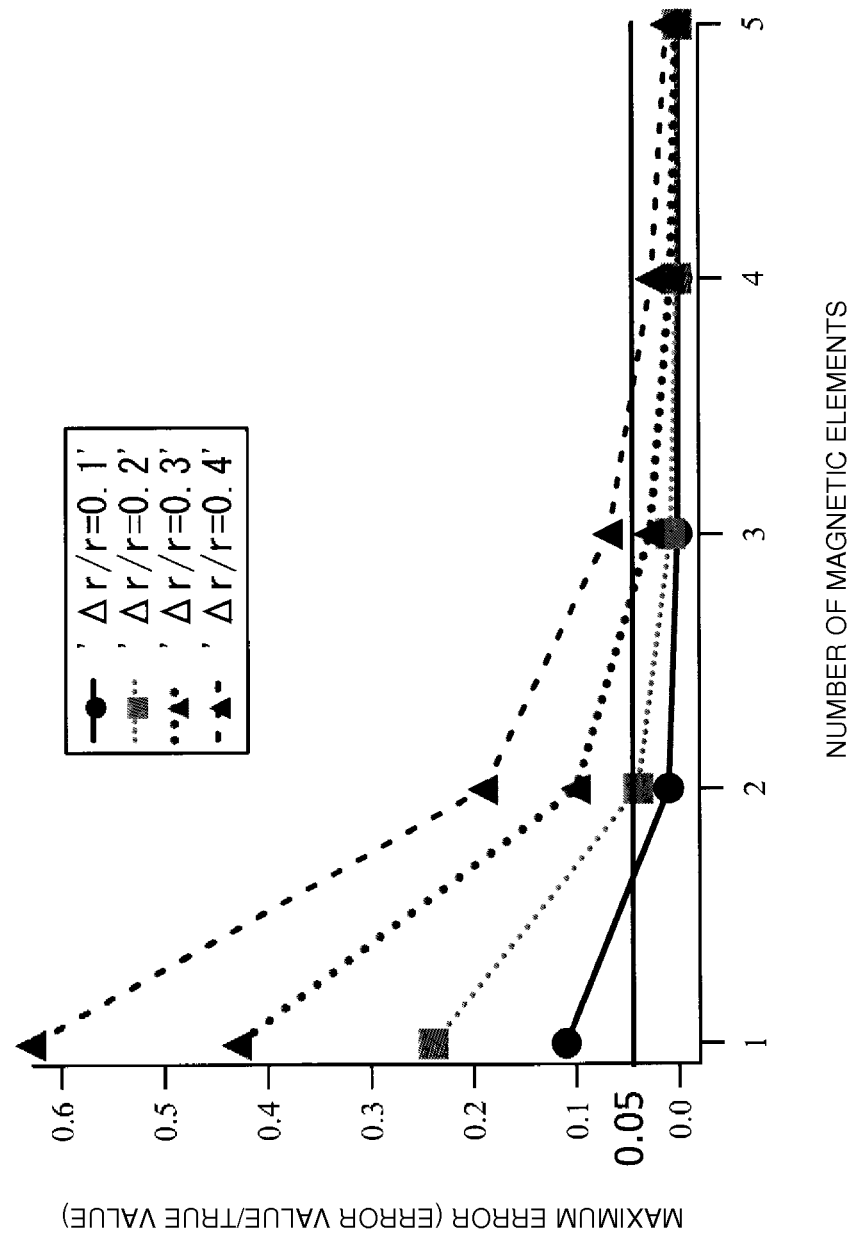
FIG. 21 is a graph illustrating a relation between the number of magnetic elements and a maximum error.

FIG. 21 illustrates a relation between the number of magnetic elements and the maximum error. In the graph, a black circle mark indicates when Δr/r is 0.1, a black square indicates when Δr/r is 0.2, a black triangle indicates when Δr/r is 0.3, and a white triangle indicates when Δr/r is 0.4. Here, when it is desired to measure the electrical power with the maximum error of 5% or less, if Δr/r is suppressed to be within 0.1, the electrical power can be sufficiently measured through even the two magnetic elements.

Of course, by increasing the number of magnetic elements 14 (which corresponds to the number of sensor parts 30) and arranging the electric wire 93a to overlap the virtual axis 17 using the holder 51 (the fixing means) fixing the magnetic elements 14 so that the magnetic elements 14 are axis-symmetric around the virtual axis 17 and face the virtual axis 17, the maximum error of the measured electrical power can be further decreased.

Figure 22:
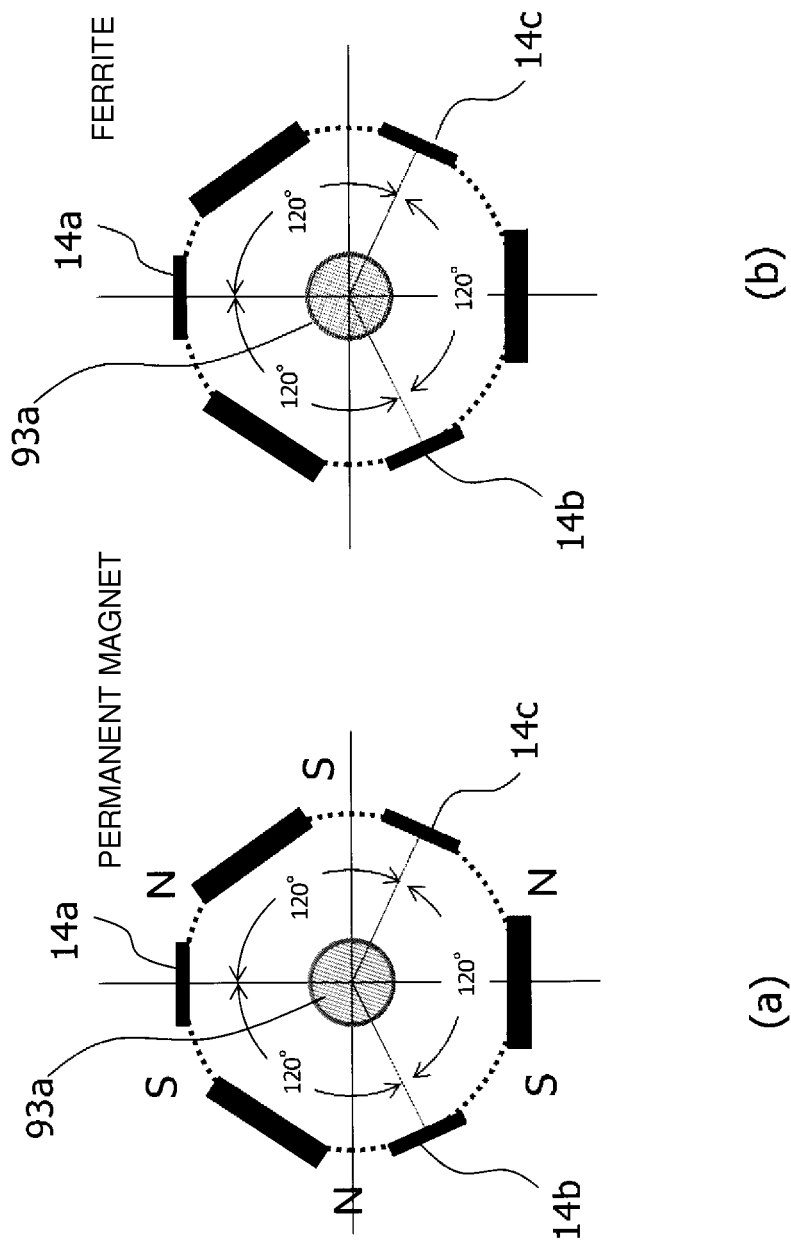
FIGS. 22(a) and 22(b) are schematic diagrams illustrating a frame 10f in which a permanent magnet is arranged between magnetic elements and a frame 10f in which a high magnetic permeability material is arranged between magnetic elements.

FIG. 22(a) illustrates a cross section of a holder 51 in which a permanent magnet is arranged between the magnetic elements 14. FIG. 22 (b) illustrates across section of a holder 51 in which a high magnetic permeability material such as ferrite is arranged. In both arrangements, an external magnetic field hardly passes through the magnetic element 14 due to the permanent magnet or the high magnetic permeability material arranged within the same circumference as the magnetic element 14. Further, the permanent magnet is a so-called hard magnetic substance capable of generating the bias magnetic field Hbias of FIG. 2. Further, the high magnetic permeability material is a so-called soft magnetic substance, and a magnetic substance in which magnetic permeability for a frequency of a power source is 10 or more may be suitably used.

Through this configuration, there is little influence of the magnetic field Hinv from the electric wire 93b arranged at the adjacent position. Further, when the permanent magnet is used, it may be used as the biasing unit 145 for the magnetic element 14. This holder 51 corresponds to one which is configured with a frame whose inner wall has a regular hexagonal shape.

(Four Embodiment)

In the first to third embodiments, the variations of the arrangement of the magnetic element 14 in the sensor unit 10 have been described. Here, the sensor unit 10 is configured with a plurality of sensor parts 30. The sensor part 30 is configured with one magnetic element 14 and one measurement resistor 22. However, in order to increase sensitivity of the sensor part 30, by changing the configuration of the magnetic element 14 and the measurement resistor 22, the sensitivity of the sensor part 30 can be improved. In the present embodiment, a variation of the sensor part 30 will be described. A plurality of variations of sensor parts 30 described herein may be used without change as the sensor part 30 in the sensor unit 10 according to the first to third embodiments.

Figure 23:
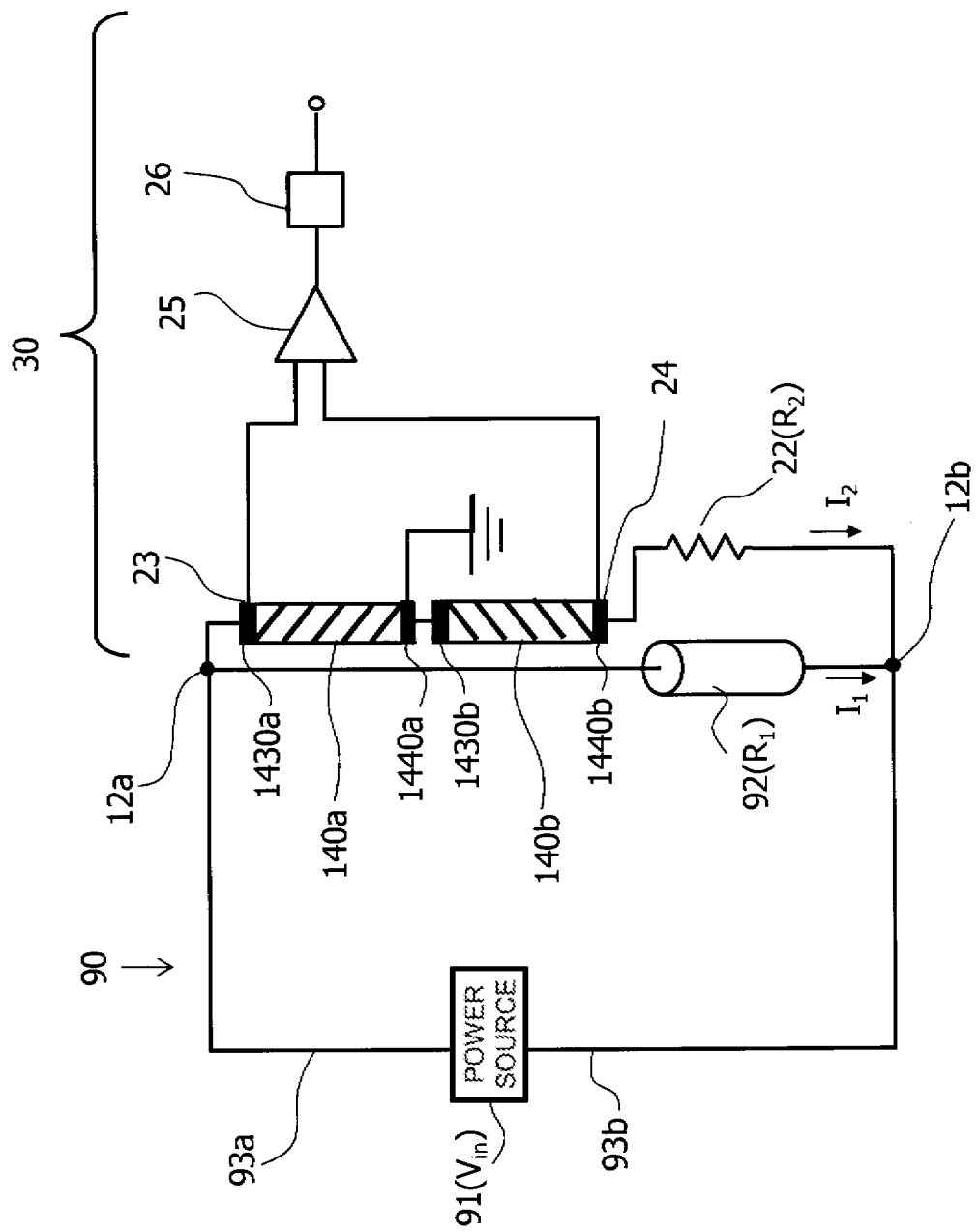
FIG. 23 is a diagram illustrating another configuration of a sensor part 30.

FIG. 23 illustrates a configuration in which magnetic elements 140a and 140b are arranged directly, and a center tap grounding a connection point of the elements is installed. The magnetic elements 140a and 140b are arranged adjacent to the electric wire 93a. In other words, instead of the magnetic elements 14a and 14b in the first to third embodiments, one in which the magnetic elements 140a and 140b are connected in series is used. In other words, one in which the magnetic elements 140a and 140b are connected to one sensor part 30 in series is used.

In this case, the measurement terminals 23 and 24 are an element terminal 1430a of the magnetic element 140a and an element terminal 1440b of the magnetic element 140b. When the sensor part 30 has this configuration, only changes of the magnetic elements 140a and 140b appear in the output of the differential amplifier 25. In other words, even when the power source is that of alternating current, it is unnecessary to add the low pass filter to the output of the differential amplifier 25.

Further, when the magnetic elements 140a and 140b have an offset, the offset is canceled since the elements are grounded.

Figure 24:
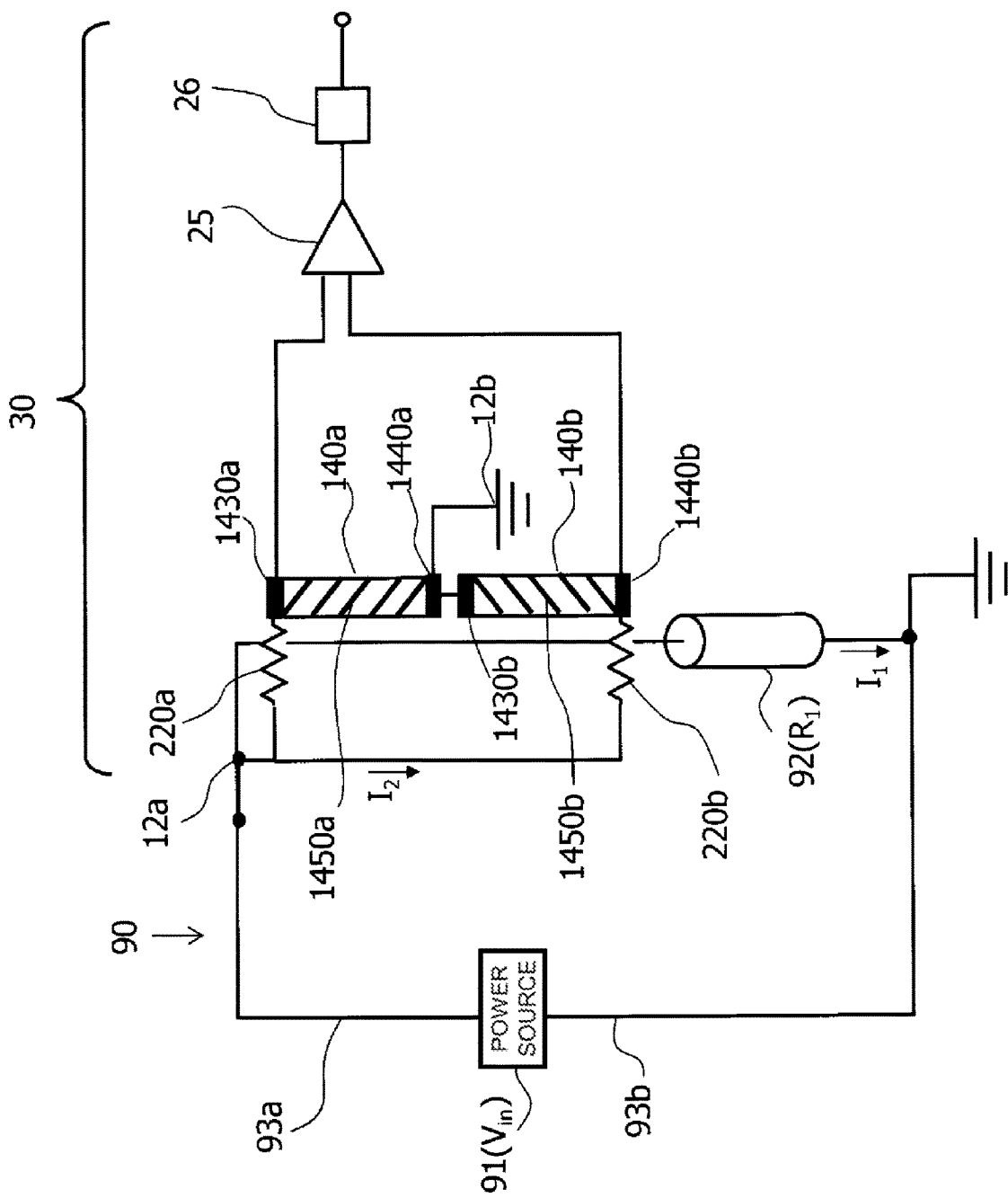
FIG. 24 is a diagram illustrating another configuration of a sensor part 30.

FIG. 24 illustrates an example in which biasing units 1450a and 1450b of the magnetic element 140a and 140b have reverse characteristics and are connected in series. Measurement resistors 220a and 220b are installed for the magnetic elements 140a and 140b, respectively. The measurement terminals 23 and 24 for the differential amplifier 25 is the element terminal 1430a of the magnetic element 140a and the element terminal 1440b of the magnetic element 140b, respectively, similarly to the example of FIG. 23.

A center tap is further installed. This wire connection merely corresponds to a bridge circuit which is formed through the measurement resistors 220a and 220b and the magnetic elements 140a and 140b. When this wire connection is performed, since the biasing units 1450a and 1450b of the magnetic elements 140a and 140b are in the reverse direction, an output that is twice larger than when one magnetic element 140 is provided is supplied to the differential amplifier 25. The other connection terminal 12b is a ground point since the power source of the circuit to be measured 90 is also grounded.

Further, since the center tap is installed, even when the power source is the AC current, only an output corresponding to a change in an element voltage can be performed. In other words, the low pass filter is unnecessary. Further, when the power source 91 is that of direct current, an effect in that the offset can be canceled is also obtained.

Figure 25:
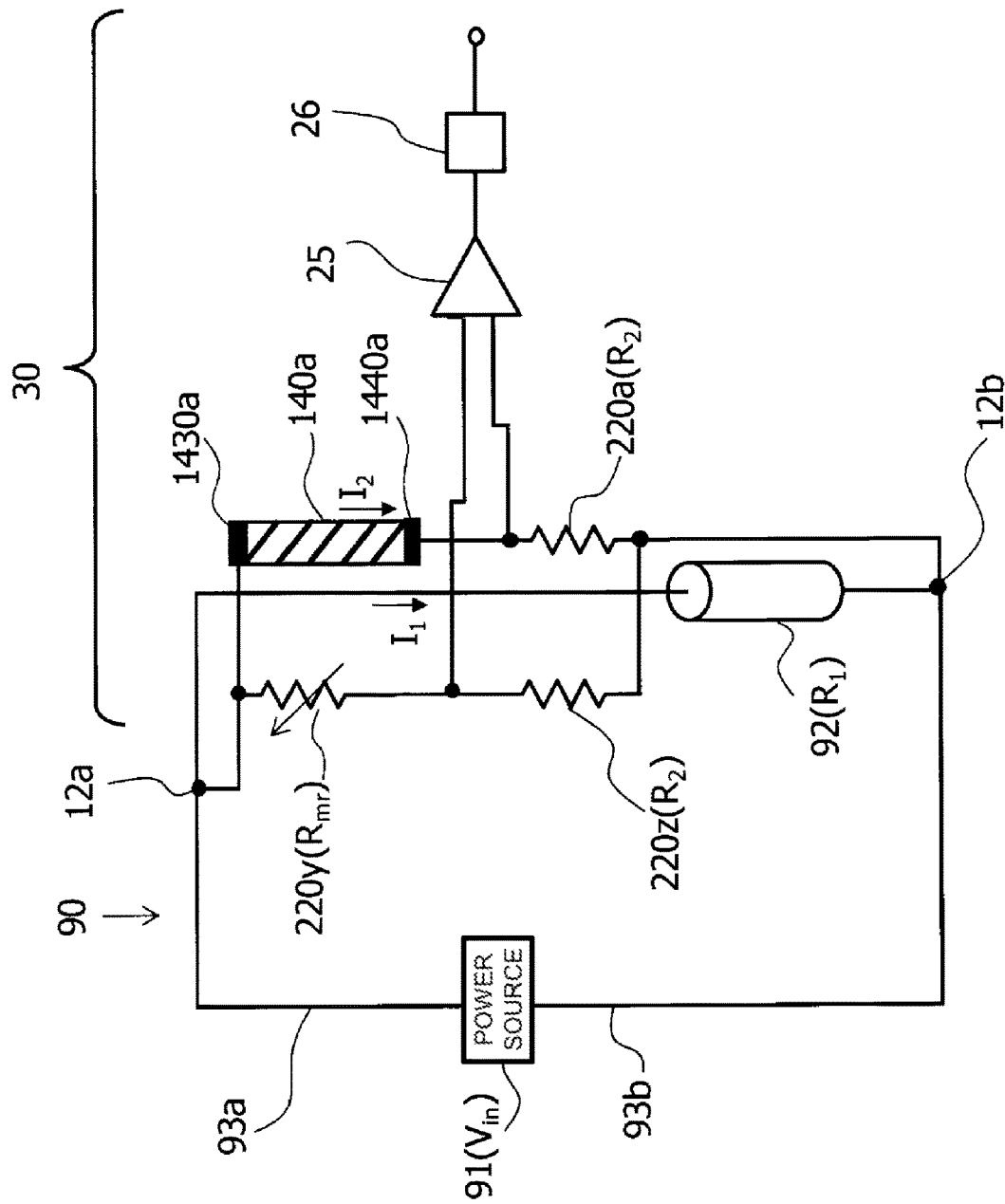
FIG. 25 is a diagram illustrating another configuration of a sensor part 30.

FIG. 25 illustrates an example in which a pseudo measurement resistor 220z and a pseudo resistor 220y corresponding to the measurement resistor 220a and the magnetic element 140a are prepared, and a bridge is formed by the four elements. Here, the resistor 220z is configured to have the same value ($R_2$) as the measurement resistor 220a, and the resistor 220y is configured to have the same resistance ($R_{mr}$) as the magnetic element 140a. When the circuit is configured as described above, even when the alternating current is superimposed on the power source, it is possible to directly obtain the direct-current voltage corresponding to the power consumption in the load 92 through an output of the differential amplifier 26.

INDUSTRIAL APPLICABILITY

The present invention can be widely used as an electrical power measurement device for electrical power measurement in a home electric appliance field, a vehicle field, an industrial equipment field, and the like.

REFERENCE SIGNS LIST 1, 2 Electrical power measurement device
10 Sensor unit
12a, 12b Connection terminal 14 (14a, 14b, 14c, 14d) Magnetic element
17 Virtual axis
21 Detector power source
22 (22a, 22b) Measurement resistor
25 (25a, 25b) Differential amplifier
26 (26a, 26b) Post-processing unit
27 (27a, 27b) Detecting means
28 Addition means
28z Amplifier
30 (30a, 30b, 30c, 30d) Sensor part
34 Control device
35 Display unit
50 Housing
51 Holder
52 Frame
53 Stopper
56 Frame
56f Planar section
56w Fixing wall
57 Frame
57a, 57b Frame piece
57m, 57n Bind
58a, 58b Inclined surface (of frame pieces)
59a, 59b Tangential line
90 Circuit to be measured
91 Power source
92 Load
93 (93a, 93b) Electric wire (power line)
93c Conducting wire
94 Shield
140a, 140b Magnetic element
141 Substrate
142 Magnetic film
143 (143a, 143b), 144 (144a, 144b) Element terminal
145 (145a, 145b) Biasing unit
148 Conductor
149 Permanent magnet
1430a, 1430b, 1440a, 1440b Element terminal
1450a, 1450b Biasing unit
EA Magnetization easy axis
L Interval of electric wire
M Magnetization
H External magnetic field
Hbias Bias magnetic field
Hinv Magnetic field generated by electric wire 93b
R28a, R28b Reception resistor
φ Angle of convex ridge

The invention claimed is:

1. An electrical power measurement device that measures electrical power consumed in a circuit including a power source, a load, and a pair of electric wires connecting the power source with the load, the electrical power measurement device comprising:
   a pair of connection terminals for connecting the load in parallel to the power source;
   a sensor part including a magnetic element in which element terminals are formed at both ends of a magnetic film, a measurement resistor connected to the magnetic element in series, and a detector that detects a voltage change of the magnetic element and outputs a voltage component based on the detected voltage change, the sensor part being connected to the circuit to be measured via the pair of connection terminals;
   a sensor unit including a plurality of the sensor parts;
   an adder that adds outputs of the detector of all the sensor parts; and
   a fixture that fixes the magnetic elements of the sensor parts, at equal distance positions from a virtual axis serving as a position reference at which one of the pair of electric wires is arranged, in a direction facing the virtual axis.

2. The electrical power measurement device according to claim 1, wherein the sensor unit is configured with two sets of the sensor parts,
   the fixture fixes the magnetic elements of the two sets of the sensor parts to axial symmetric positions to the virtual axis, and
   a planar section on which the other electric wire is arranged extends to a plane on which the one sensor part is arranged.

3. The electrical power measurement device according to claim 1,
   wherein the sensor unit is configured with two sets of the sensor parts, and
   the fixture fixes the magnetic element to each of a pair of inclined planes including a tangential line extending from a center of the other electric wire toward a surface of the one electric wire when a center of the one electric wire is arranged on the virtual axis, and the other electric wire is fixed adjacent to the one electric wire.

4. The electrical power measurement device according to claim 1,
   wherein the fixture fixes the magnetic elements of the sensor parts to axial symmetric positions to the virtual axis, and
   further fixes a magnetic substance to a position between the magnetic elements at the same distance as a distance from the virtual axis to the magnetic element.

5. The electrical power measurement device according to claim 4, wherein the magnetic substance is a permanent magnet.

6. The electrical power measurement device according to claim 4,
   wherein the magnetic substance is a high magnetic permeability material.

7. The electrical power measurement device according to claim 1,
   wherein in the sensor part,
   the element terminal of the magnetic element at a side that is not connected to the measurement resistor is connected to the one connection terminal,
   a terminal of the measurement resistor at a side that is not connected to the magnetic element is connected to the other connection terminal, and
   the element terminals are used as measurement terminals.

8. The electrical power measurement device according to claim 1,
   wherein in the sensor part,
   the element terminal of the magnetic element at a side that is not connected to the measurement resistor is connected with one element terminal of a second magnetic element,
   the other terminal of the second magnetic element is connected to the one connection terminal,
   a terminal of the measurement resistor at a side that is not connected to the magnetic element is connected to the other connection terminal, and
   the one element terminal of the second magnetic element is further grounded.

9. The electrical power measurement device according to claim 1,
   wherein in the sensor part, the element terminal of the magnetic element at a side that is not connected to the measurement resistor is connected to the one connection terminal, a terminal of the measurement resistor at a side that is not connected to the magnetic element is connected to the other connection terminal, the sensor part includes a variable resistor, one end of which is connected to the one connection terminal, and a variable measurement resistor, one end of which is connected to the other end of the variable resistor and the other end of which is connected to the other connection terminal, and a connection point between the magnetic element and the measurement resistor and a connection point between the variable resistor and the variable measurement resistor are used as measurement terminals.

10. The electrical power measurement device according to claim 1, further comprising, a display unit that displays a result of the adder.

* * * * *